US012484422B2

(12) United States Patent
Kano et al.

(10) Patent No.: US 12,484,422 B2
(45) Date of Patent: Nov. 25, 2025

(54) DISPLAY APPARATUS AND ELECTRONIC DEVICE

(71) Applicant: SONY SEMICONDUCTOR SOLUTIONS CORPORATION, Kanagawa (JP)

(72) Inventors: Tatsuya Kano, Kanagawa (JP); Takashi Sakairi, Kanagawa (JP); Tomoyoshi Ichikawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 343 days.

(21) Appl. No.: 18/256,948

(22) PCT Filed: Dec. 14, 2021

(86) PCT No.: PCT/JP2021/046059
§ 371 (c)(1),
(2) Date: Jun. 12, 2023

(87) PCT Pub. No.: WO2022/131255
PCT Pub. Date: Jun. 23, 2022

(65) Prior Publication Data
US 2024/0040908 A1 Feb. 1, 2024

(30) Foreign Application Priority Data

Dec. 18, 2020 (JP) .................................. 2020-210481

(51) Int. Cl.
*H10K 59/80* (2023.01)
(52) U.S. Cl.
CPC .................................. *H10K 59/876* (2023.02)
(58) Field of Classification Search
CPC .. H10K 59/852; H10K 59/876; H10K 50/852; H10K 50/876
(Continued)

(56) References Cited

U.S. PATENT DOCUMENTS

| 2014/0027792 A1* | 1/2014 | Iwasaki | H10H 20/83 |
| | | | 257/99 |
| 2014/0167604 A1* | 6/2014 | Iwata | H05B 33/22 |
| | | | 313/504 |

(Continued)

FOREIGN PATENT DOCUMENTS

| CN | 112289943 A * | 1/2021 | ............. H10K 59/38 |
| JP | 2006-032327 A | 2/2006 | |

(Continued)

OTHER PUBLICATIONS

International Search Report and Written Opinion of PCT Application No. PCT/JP2021/046059, issued on Mar. 1, 2022, 09 pages of ISRWO.

*Primary Examiner* — Christopher M Raabe
(74) *Attorney, Agent, or Firm* — CHIP LAW GROUP

(57) ABSTRACT

Provided are a display apparatus and an electronic device having excellent color purity. A display apparatus includes a plurality of first electrodes disposed two-dimensionally, a second electrode disposed on a side of a first surface of each of the first electrodes, an electroluminescence layer disposed between the first electrodes and the second electrode, a reflector facing a second surface of each of the first electrodes, an interlayer film covering the reflector, and an insulating layer provided between adjacent first electrodes of the plurality of first electrodes and having a plurality of openings, in which each of the openings is provided on the first surface of each of the first electrodes, and the reflector, the interlayer film, the first electrodes, the electroluminescence layer, and the second electrode constitute a resonator structure that resonates emitted light from the electroluminescence layer, and in a case where a region corresponding to each of the openings is a first region and a region corresponding to an outer side of the first region in a region corresponding to each of the first electrodes is a second (Continued)

region in a plan view, a resonance order of a portion corresponding to the first region and a resonance order of a portion corresponding to the second region are different in the resonator structure.

14 Claims, 14 Drawing Sheets

(58) Field of Classification Search
USPC .................................................. 313/498–512
See application file for complete search history.

(56) References Cited

U.S. PATENT DOCUMENTS

| | | | |
|---|---|---|---|
| 2018/0130852 A1* | 5/2018 | Hsu ........................ | H10K 59/86 |
| 2021/0013453 A1* | 1/2021 | Matsuda .............. | H10K 59/879 |
| 2023/0189555 A1* | 6/2023 | Ito ........................ | H10K 59/879 |
| | | | 257/80 |
| 2023/0320179 A1* | 10/2023 | Ichikawa ............. | H10K 59/876 |
| | | | 257/40 |

FOREIGN PATENT DOCUMENTS

| | | | |
|---|---|---|---|
| JP | 2007-234581 A | | 9/2007 |
| JP | 2009-231274 A | | 10/2009 |
| JP | 2013-109996 A | | 6/2013 |
| JP | 2013201051 A | * | 10/2013 |
| JP | 2014-022349 A | | 2/2014 |
| JP | 2014-235959 A | | 12/2014 |
| JP | 2016-170934 A | | 9/2016 |
| KR | 20230114644 A | * | 8/2023 ............. H10K 59/35 |

* cited by examiner

DISPLAY APPARATUS AND ELECTRONIC DEVICE

CROSS REFERENCE TO RELATED APPLICATIONS

This application is a U.S. National Phase of International Patent Application No. PCT/JP2021/046059 filed on Dec. 14, 2021, which claims priority benefit of Japanese Patent Application No. JP 2020-210481 filed in the Japan Patent Office on Dec. 18, 2020. Each of the above-referenced applications is hereby incorporated herein by reference in its entirety.

TECHNICAL FIELD

The present disclosure relates to a display apparatus and an electronic device using the display apparatus.

BACKGROUND ART

As a technique for improving light extraction efficiency in a display apparatus including an electroluminescence layer (hereinafter, simply referred to as a display apparatus), for example, as disclosed in Patent Document 1, there is known a resonator structure including a reflector, an interlayer film, a plurality of transparent electrodes disposed two-dimensionally, an electroluminescence layer, and a semi-transmissive electrode in this order. In the resonator structure, emitted light from the electroluminescence layer is resonated.

CITATION LIST

Patent Document

Patent Document 1: Japanese Patent Application Laid-Open No. 2014-235959

SUMMARY OF THE INVENTION

Problems to be Solved by the Invention

In a display apparatus having a resonator structure, it is required to suppress a problem that light of a color different from a color of light desired to be extracted in a subpixel is extracted in a peripheral portion of the subpixel. Therefore, in the display apparatus having the resonator structure, there is room for improvement in terms of enhancement in color purity.

The present disclosure has been made in view of the above points, and an object of the present disclosure is to provide a display apparatus and an electronic device having excellent color purity.

Solutions to Problems

The present disclosure is, for example, (1) a display apparatus including a plurality of first electrodes disposed two-dimensionally, a second electrode disposed on a side of a first surface of each the first electrodes, an electroluminescence layer disposed between the first electrodes and the second electrode, a reflector facing a second surface of each of the first electrodes, an interlayer film covering the reflector, and an insulating layer provided between adjacent first electrodes of the plurality of first electrodes and having a plurality of openings, in which each of the openings is provided on the first surface of each of the first electrodes, and the reflector, the interlayer film, the first electrodes, the electroluminescence layer, and the second electrode constitute a resonator structure that resonates emitted light from the electroluminescence layer, and in a case where a region corresponding to each of the openings is a first region and a region corresponding to an outer side of the first region in a region corresponding to each of the first electrodes is a second region in a plan view, a resonance order of a portion corresponding to the first region and a resonance order of a portion corresponding to the second region are different in the resonator structure.

Furthermore, the present disclosure may be (2) an electronic device including the display apparatus according to (1), for example.

MODE FOR CARRYING OUT THE INVENTION

Figure 1:
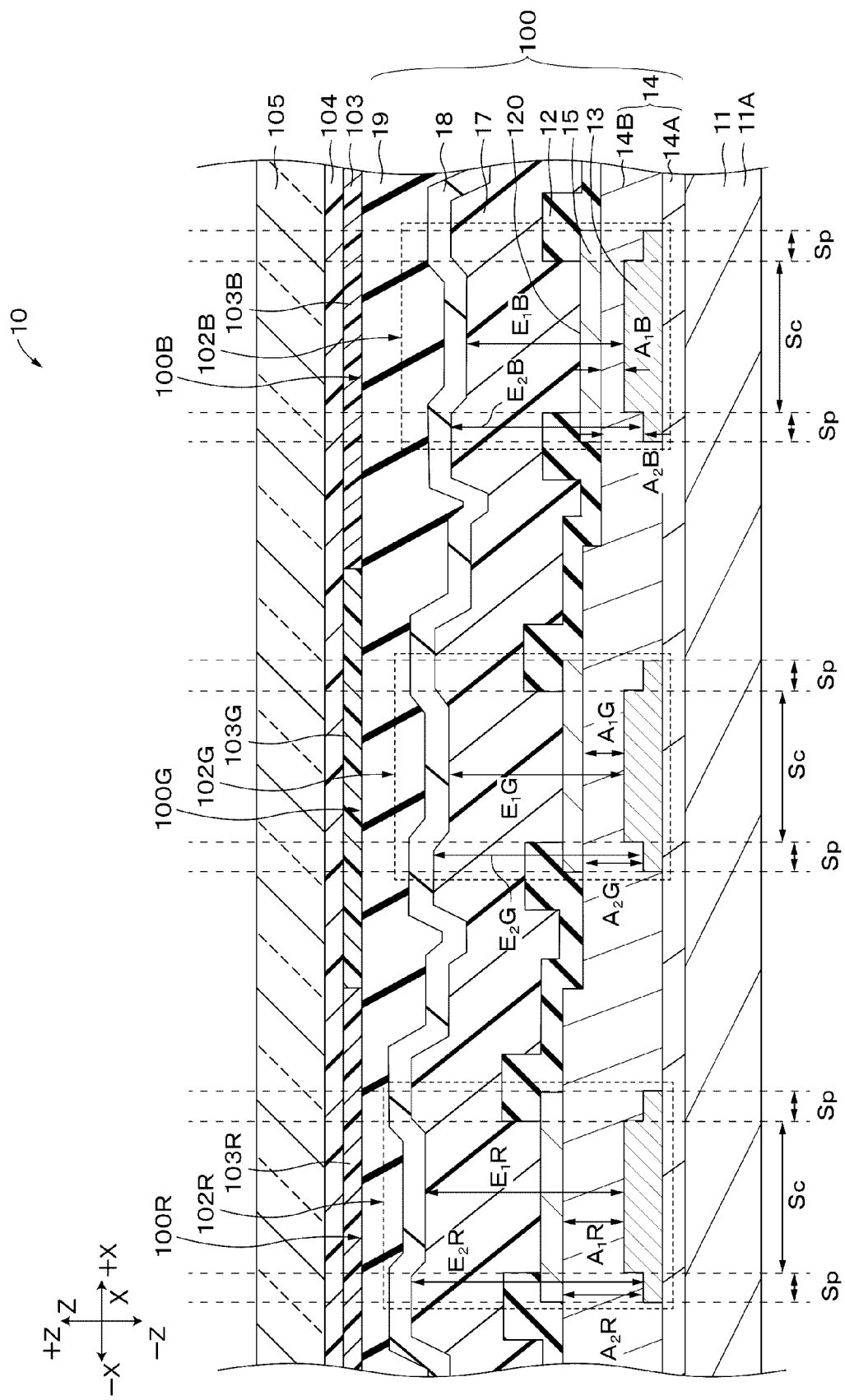
FIG. 1 is a sectional view for describing an implementation example of a display apparatus.

Hereinafter, an implementation example and the like according to the present disclosure will be described with reference to the drawings. Note that the description will be made in the following order. In the present specification and the drawings, components having substantially the same functional configuration are denoted by the same reference signs, and redundant description is omitted.

Note that the description will be made in the following order.
1. First Embodiment
2. Second Embodiment
3. Third Embodiment 4. Fourth Embodiment
5. Fifth Embodiment
6. Manufacturing method
7. Electronic device The following description is about preferred specific examples of the present disclosure, and the content of the present disclosure is not limited to embodiments and the like for implementing the examples. In addition, in the following description, directions such as front and rear, left and right, and up and down are indicated in consideration of convenience of description, but the content of the present disclosure is not limited to these directions. In examples of FIGS. 1, 2A, and 2B, it is assumed that a Z-axis direction is an up-down direction (upside is +Z direction, and downside is -Z direction), an X-axis direction is a front-rear direction (front side is +X direction, and rear side is -X direction), and a Y-axis direction is a left-right direction (right side is +Y direction, and left side is -Y direction), and the description will be made on the basis of the above directions. FIGS. 3, 4A, 4B, 5, 6, 7, 8, 9, 10, 11A, 11B, 11C, 11D, 11E, 11F, 11G, 12A, 12B, 12C, 12D, and 12E are similar to the above. Relative magnitude ratios of sizes and thicknesses of layers shown in the drawings of FIG. 1 and the like are described for convenience, and do not limit actual magnitude ratios. FIGS. 2A, 2B, 3, 4A, 4B, 5, 6, 7, 8, 9, 10, 11A, 11B, 11C, 11D, 11E, 11F 11G, 12A, 12B, 12C, 12D, and 12E are similar regarding the definition of the directions and the magnitude ratios.

1 First Embodiment

[1-1 Configuration of Display Apparatus]

Figure 3:
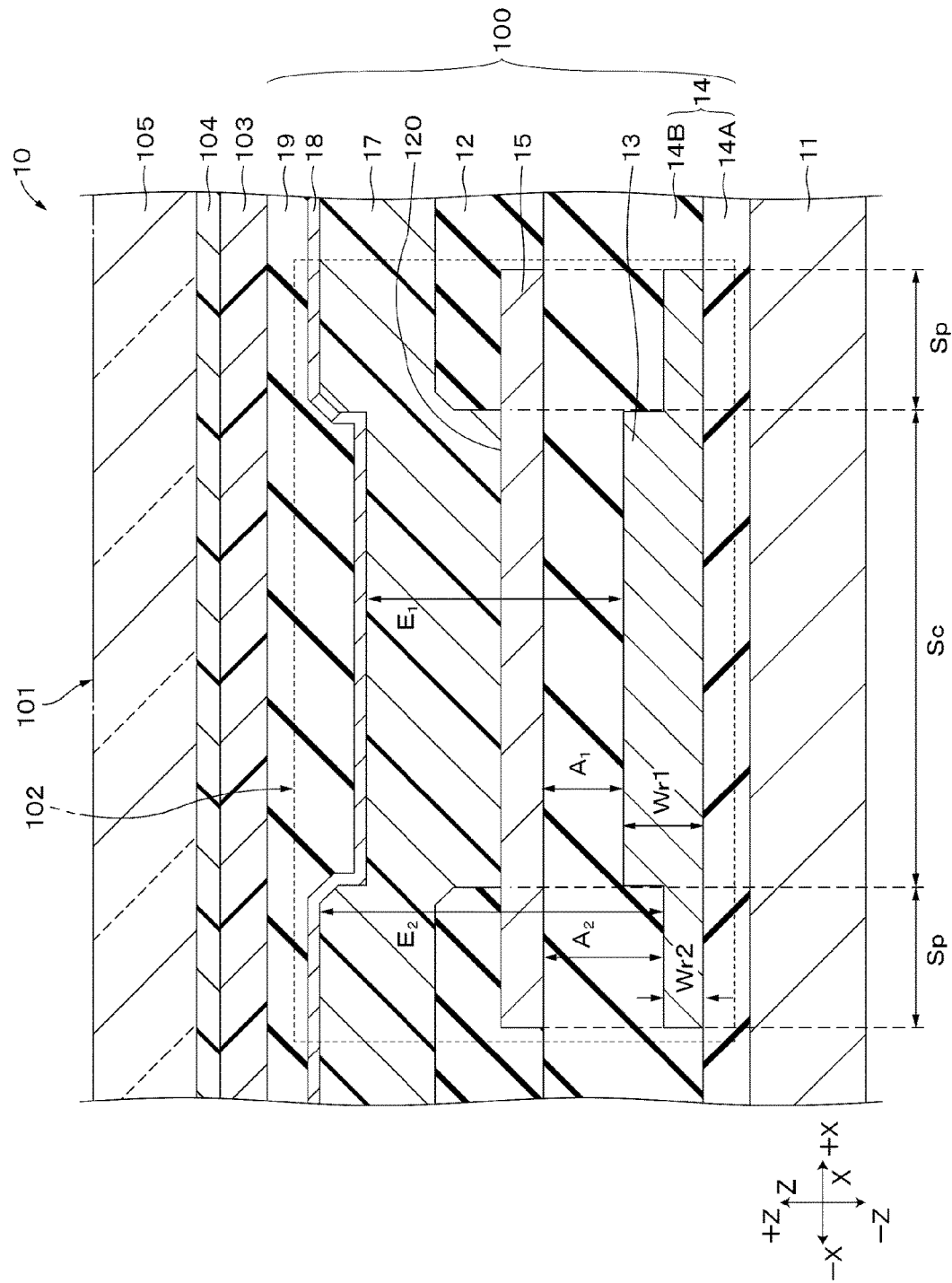
FIG. 3 is a sectional view for describing a display apparatus according to a first embodiment.

FIGS. 1 and 3 are sectional views each showing a configuration example of a display apparatus 10 as an implementation example of the present disclosure. The display apparatus 10 includes a drive substrate 11, a plurality of reflectors 13, an interlayer film 14, a plurality of first electrodes 15, an electroluminescence layer, a second electrode 18, and a protective layer 19, and includes an insulating layer 12 disposed between the adjacent first electrodes 15. Hereinafter, a case where the electroluminescence layer is an organic EL layer 17 will be described as an example. FIG. 3 is a sectional view obtained by extracting a portion of one subpixel in FIG. 1.

The display apparatus 10 is a top emission type display apparatus. In the display apparatus 10, the drive substrate 11 is located on a side of a reverse surface of the display apparatus 10, and a direction from the drive substrate 11 toward the organic EL layer 17 (+Z direction) is a direction toward a main surface (display surface 10A) of the display apparatus 10. In the following description, in each layer constituting the display apparatus 10, a surface closer to the display surface 10A of the display apparatus 10 is referred to as a first surface (upper surface), and a surface on the side of the reverse surface of the display apparatus 10 is referred to as a second surface (lower surface).

(Organic EL Element)

Figure 2A:
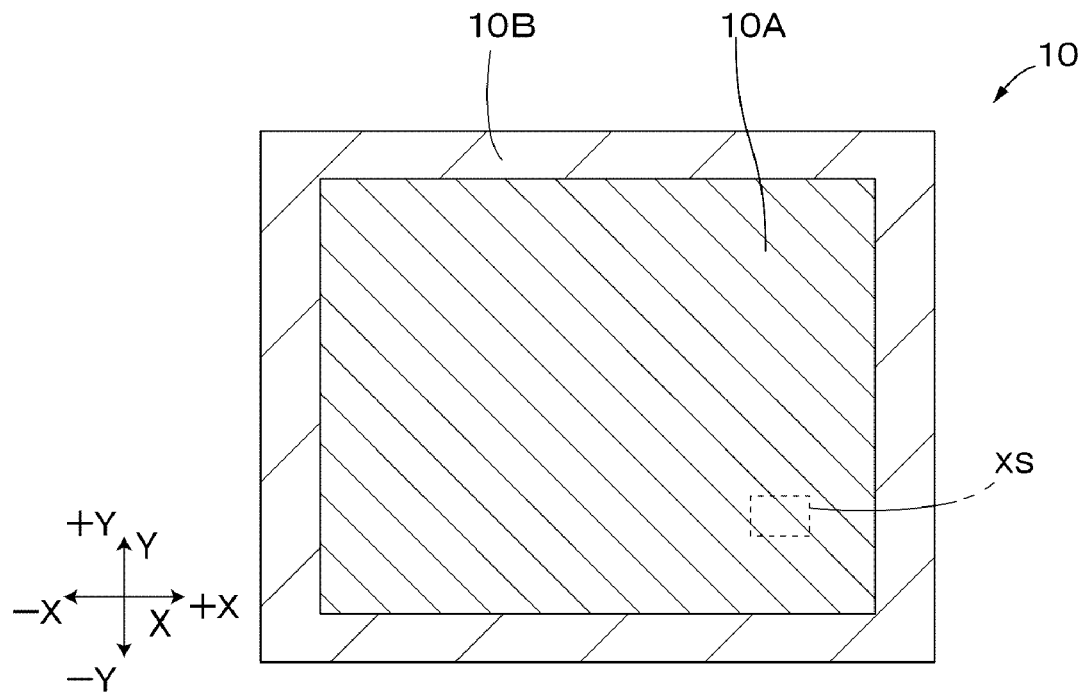
FIG. 2A is a plan view for describing one implementation example of the display apparatus.

In the display apparatus 10, the reflectors 13, the interlayer film 14, the first electrodes 15, the organic EL layer 17, and the second electrode 18 formed on the drive substrate 11 constitute an organic EL element 100. In the display apparatus 10, a plurality of organic EL elements 100 is formed corresponding to a pixel layout. The layout of the organic EL elements 100 is not limited. In an example of FIG. 2A, the plurality of organic EL elements 100 is two-dimensionally aligned in predetermined two directions (the X-axis direction and the Y-axis direction in FIG. 2A). FIG. 2A is a plan view for describing an implementation example of the display surface 10A of the display apparatus 10. In FIG. 2A, reference sign 10B denotes a non-display portion surrounding the display surface 10A.

(Configuration of Pixel)

Figure 2B:
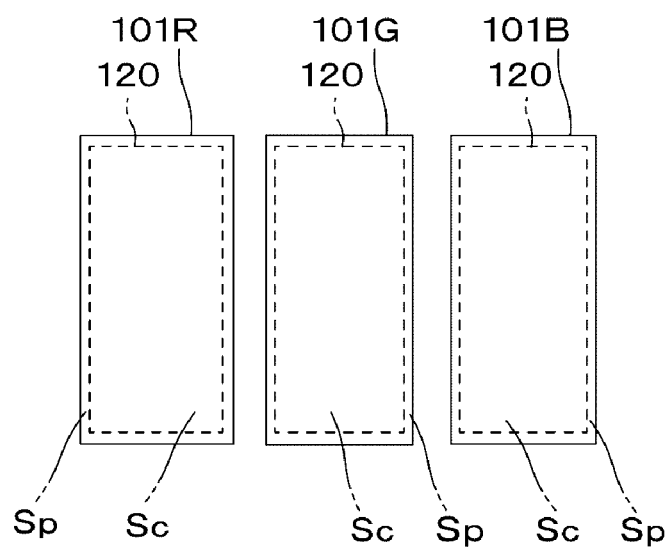
FIG. 2B is a partially enlarged plan view in which a portion of a region XS surrounded by a broken line in FIG. 2A is enlarged.

In an example of the display apparatus 10 shown in FIG. 2B, one pixel is formed by a combination of a plurality of subpixels corresponding to a plurality of color types. In this example, three colors of red, blue, and green are determined as the plurality of color types, and three types of a subpixel 101R, a subpixel 101G, and a subpixel 101B are provided as the subpixels. The subpixel 101R, the subpixel 101G, and the subpixel 101B are a red subpixel, a blue subpixel, and a green subpixel, respectively, and display red, blue, and green, respectively. In the example of the display apparatus 10 shown in FIGS. 2A, 2B, and the like, an organic EL element 100R, an organic EL element 100G, and an organic EL element 100B are provided corresponding to the subpixel 101R, the subpixel 101G, and the subpixel 101B. However, the examples of FIGS. 2A, 2B, and the like are merely examples, and the display apparatus 10 is not limited to a case where there is a plurality of subpixels corresponding to a plurality of color types. There may be one color type, or a pixel may be formed without a subpixel. In addition, light (red light, green light, and blue light, respectively) corresponding to each color type of red, green, and blue can be defined as light having a dominant wavelength in a range of 610 nm to 650 nm, a range of 510 nm to 590 nm, and a wavelength range of 440 nm to 480 nm, respectively.

Figure 4A:
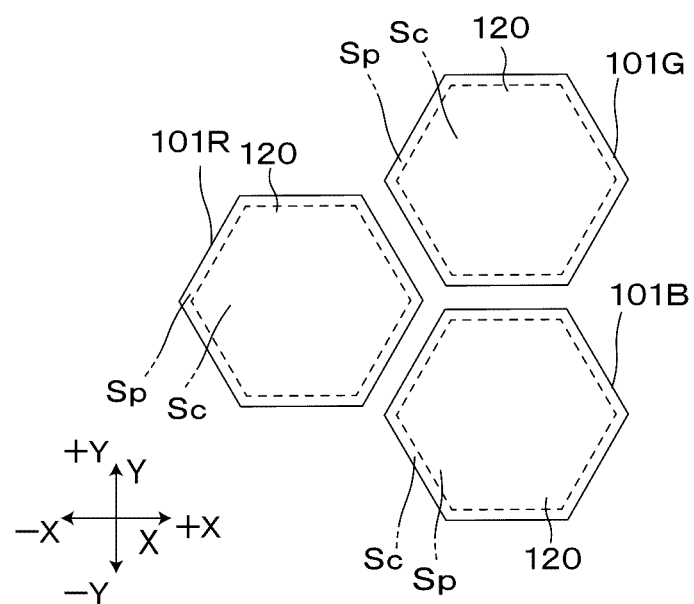
FIGS. 4A and 4B are plan views each showing an example of a layout of subpixels of the display apparatus.
Figure 4B:
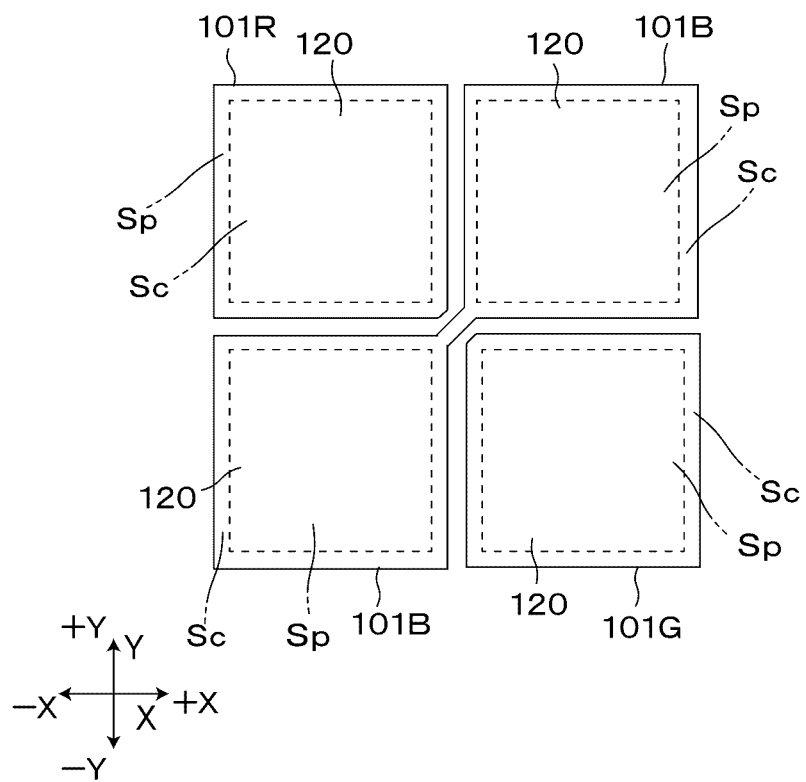

The layout of the subpixels 101R, 101G, and 101B is a stripe-shaped layout in the example of FIGS. 1 and 2B, but is not limited to this example. The layout of the subpixels 101R, 101G, and 101B may be, for example, a delta-shaped layout as shown in FIG. 4A or a square arrangement as shown in FIG. 4B. The shapes of the subpixels 101R, 101G, and 101B are also not limited.

In the following description, in a case where the subpixels 101R, 101G, and 101B are not distinguished, the term "subpixel 101" is used. In a case where the organic EL elements 100R, 100G, and 100B are not distinguished, the term "organic EL element 100" is used. Furthermore, as for the drawings, in an example of FIG. 3, a part of one subpixel 101 and the organic EL element 100 are extracted and shown. However, as shown in the examples of FIGS. 1, 2A, and 2B, in a case where there is a plurality of subpixels 101, for example, in a case where there are a plurality of subpixels 101R, 101G, and 101B, a similar configuration can be adopted for each of the plurality of organic EL elements 100R, 100G, and 100B corresponding to the plurality of subpixels 101R, 101G, and 101B.

The configuration of the organic EL element and the configuration of the pixel described above are similar to those of second to fifth embodiments described later, modifications of the embodiments, and examples of a manufacturing method. Also in the second to fifth embodiments, modifications of the embodiments, and the manufacturing method, in the display apparatus 10, one pixel may be formed by a combination of a plurality of subpixels corresponding to a plurality of color types, one color type may be used, or a pixel may be formed without a subpixel.

(Drive Substrate)

In the drive substrate 11, various circuits that drive the plurality of organic EL elements 100 are provided on a substrate 11A. Examples of the various circuits include a drive circuit that controls driving of the organic EL element 100 and a power supply circuit that supplies power to the plurality of organic EL elements 100 (none of which are shown).

The substrate 11A may include, for example, glass or resin having low permeability for moisture and oxygen, or may include a semiconductor in which a transistor or the like is easily formed. Specifically, the substrate 11A may be a glass substrate, a semiconductor substrate, a resin substrate, or the like. The glass substrate includes, for example, high strain point glass, soda glass, borosilicate glass, forsterite, lead glass, quartz glass, or the like. The semiconductor substrate includes, for example, amorphous silicon, polycrystalline silicon, single crystal silicon, or the like. The resin substrate includes, for example, at least one selected from the group consisting of polymethyl methacrylate, polyvinyl alcohol, polyvinyl phenol, polyether sulfone, polyimide, polycarbonate, polyethylene terephthalate, polyethylene naphthalate, and the like.

A plurality of contact plugs (not shown) for connecting the organic EL element 100 and various circuits provided on the substrate 11A is provided on the first surface of the drive substrate 11.

(Resonator Structure)

A resonator structure 102 is formed in the display apparatus 10. The resonator structure 102 is a cavity structure and is a structure that resonates emitted light from the organic EL layer 17 described later. In the display apparatus 10, the resonator structure 102 is formed in the organic EL element 100, and the reflector 13, the interlayer film 14, the first electrode 15, the organic EL layer 17, and the second electrode 18 constitute the resonator structure 102. Resonating the emitted light from the organic EL layer 17 means resonating light of a specific wavelength included in the emitted light.

In the example of the display apparatus 10 shown in FIGS. 1, 2A, 2B and 3, the organic EL layer 17 uses white light as emitted light, and the resonator structure 102 resonates light of a specific wavelength included in the white light. At this time, light having a predetermined wavelength among the white light from the organic EL layer 17 is emphasized. Then, light is emitted from the second electrode 18 of the organic EL element 100 toward the outside in a state where the light of the predetermined wavelength is emphasized. Note that the light of the predetermined wavelength is light corresponding to a predetermined color type, and indicates light corresponding to a color type determined in accordance with the subpixel 101. In the examples of FIGS. 1, 2A, 2B, and 3, the display apparatus 10 includes the subpixels 101R, 101G, and 101B, and the organic EL elements 101R, 101G, and 101B according to the subpixels 100R, 100G, and 100B, respectively. Resonator structures 102R, 102G, and 102B are formed in the organic EL elements 100R, 100G, and 100B, respectively. In the resonator structure 102R, red light of the emitted light from the organic EL layer 17 resonates. Light is emitted from the second electrode 18 of the organic EL element 100R toward the outside in a state where the red light is emphasized. In the resonator structures 102G and 102B, green light and blue light of the emitted light from the organic EL layer 17 resonate. Light is emitted from the second electrode 18 of the organic EL elements 100G and 100B toward the outside in a state where the green light and the blue light are emphasized. Note that, in the present specification, in a case where the resonator structures 102R, 102G, and 102B are not distinguished, the term "resonator structure 102" is used.

(Setting of Optical Path Length)

Resonance of the emitted light from the organic EL layer 17 is achieved by reflection between the second electrode 18 and the reflector 13. An optical path length (which may be referred to as an optical distance) between the second electrode 18 and the reflector 13 is set in accordance with light of a predetermined color type. The predetermined color type is a desired color type for the subpixel 101 to emit light. For example, in the resonator structure 101R formed in the subpixel 102R, the optical path length between the reflector 13 and the second electrode 18 is set so as to generate resonance of red light. In the resonator structures 102G and 102B formed in the subpixels 101G and 101B, the optical path lengths between the reflector 13 and the second electrode 18 are set so as to generate resonance of green light and blue light, respectively.

(First Region and Second Region)

In a plan view of the display apparatus 10, in a case where a region corresponding to an opening 120 described later is a first region Sc, and a region corresponding to an outer side of the first region Sc in a region corresponding to the first electrode 15 is a second region Sp, in the resonator structure 102 in the display apparatus 10, a structure that resonates the emitted light from the organic EL layer 17 is formed for both portions corresponding to the first region Sc and the second region Sp.

Hereinafter, for convenience of description, a portion of the resonator structure 102 corresponding to the first region Sc is referred to as a first resonance structure $E_1$ (represented by a range indicated by a double-headed arrow in FIG. 3). In addition, a portion of the resonator structure 102 corresponding to the second region Sp is referred to as a second resonance structure $E_2$ (represented by a range indicated by a double-headed arrow in FIG. 3). In the first resonance structure $E_1$ and the second resonance structure $E_2$, first resonance structures $E_1R$, $E_1G$, and $E_1B$ and second resonance structures $E_2R$, $E_2G$, and $E_2B$ are formed in the subpixels 101R, 101G, and 101G, respectively. In a case where the first resonance structures $E_1R$, $E_1G$, and $E_1B$ are not distinguished, the first resonance structure $E_1$ is used, and in a case where the second resonance structures $E_2R$, $E_2G$, and $E_2B$ are not distinguished, the second resonance structure $E_2$ is used. Note that the "region corresponding to the outer side of the first region Sc in the region corresponding to the first electrode 15" which indicates the second region Sp is a region corresponding to an outer peripheral edge of the opening 120 in a plan view of the display apparatus 10, and is a region where the insulating layer 12 and the first electrode 15 overlap.

Formation of each of the first resonance structure $E_1$ and the second resonance structure $E_2$ can be achieved by setting the optical path length (optical distance) between the second electrode 18 and the reflector 13 in accordance with light of a predetermined color type.

(Resonance Order)

In the display apparatus 10, the resonator structure 102 is formed in both the portion corresponding to the first region Sc and the portion corresponding to the second region Sp. Furthermore, in the resonator structure 102, a resonance order in the portion corresponding to the first region Sc is different from a resonance order in the portion corresponding to the second region Sp. That is, in the display apparatus 10, a resonance order of the first resonance structure $E_1$ and a resonance order of the second resonance structure $E_2$ in the resonator structure 102 are different. The example shown in FIG. 3 can be achieved by forming, in the resonator structure 102, a configuration in which the optical path length between the second electrode 18 and the reflector 13 in the portion corresponding to the first region Sc is set to a value according to the resonance order of the first resonance structure $E_1$, and a configuration in which the optical path length between the second electrode 18 and the reflector 13 in the portion corresponding to the second region Sp is set to a value according to the resonance order of the second resonance structure $E_2$.

(Resonance Condition)

In the resonator structure 102, a configuration in which the resonance order of the first resonance structure $E_1$ is different from the resonance order of the second resonance structure $E_2$ preferably satisfies a resonance condition. The resonance condition indicates that the following formulas 1 and 2 are satisfied and one of a combination of the following formulas 3 and 4 or a combination of the following formulas 5 and 6 is satisfied.

$2L_1/\lambda + \varphi/2\pi = m_1$ (Formula 1)

$2L_2/\lambda + \varphi/2\pi = m_2$ (Formula 2)

$m_1 \geq 2$ (Formula 3)

$m_2 = m_1 \pm 1$ (Formula 4)

$m_1 = 1$ (Formula 5)

$m_2 = 2$ (Formula 6)

In each of the above formulas 1 to 6, $L_1$ represents an optical distance [nm] between the reflector 13 and the second electrode 18 in a portion corresponding to the first region Sc, $L_2$ represents an optical distance [nm] between the reflector 13 and the second electrode 18 in a portion corresponding to the second region Sp, $\lambda$ represents a peak wavelength [nm] of a spectrum of light corresponding to a predetermined color type, $\varphi$ represents a magnitude [rad] (radian) of a phase shift caused by reflection of light on the reflector 13 and the second electrode 18, $m_1$ represents an integer that is a resonance order in a portion corresponding to the first region Sc, and $m_2$ represents an integer that is a resonance order in a portion corresponding to the second region Sp. The light corresponding to the predetermined color type corresponds to light desired to be extracted to the outside.

The optical distance $L_1$ indicates a sum of products of thicknesses and refractive indexes of the respective layers that form a portion corresponding to the first region Sc and are formed between the reflector 13 and the second electrode 18. For example, in a case where the thicknesses [nm] of the respective layers (for example, layers that form a portion of the interlayer film 14 interposed between the reflector 13 and the first electrode 15, the first electrode 15, and the organic EL layer 17) forming the portion corresponding to the first region Sc and formed between the reflector 13 and the second electrode 18 are denoted by $d_11, d_12, d_13 \ldots$, and $d_1k_1$ ($k_1$ is the number (integer) of layers forming the portion corresponding to the first region Sc), and the refractive indexes corresponding to the respective layers are denoted by $n_11, n_12, n_13 \ldots$, and $n_1k_1$, $L_1$ is a value calculated by $d_11 \times n_11 + d_12 \times n_12 + d_13 \times n_13 + \ldots + d_1k_1 \times n_1k_1$. The optical distance $L_1$ corresponds to an optical distance of the first resonance structure $E_1$.

The optical distance $L_2$ indicates a sum of products of thicknesses and refractive indexes of the layers that form a portion corresponding to the second region Sp and are formed between the reflector 13 and the second electrode 18. For example, in a case where the thicknesses [nm] of the respective layers (for example, layers that form a portion of the interlayer film 14 interposed between the reflector 13 and the first electrode 15, the first electrode 15, and the organic EL layer 17) forming the portion corresponding to the second region Sp and formed between the reflector 13 and the second electrode 18 are denoted by $d_21, d_22, d_23 \ldots$, and $d_2k_2$ ($k_2$ is the number (integer) of layers forming the portion corresponding to the second region Sp), and the refractive indexes corresponding to the respective layers are denoted by $n_21, n_22, n_23 \ldots$, and $n_2k_2$, $L_2$ is a value calculated by $d_21 \times n_21 + d_22 \times n_22 + d_23 \times n_23 + \ldots + d_2k_2 \times n_2k_2$. The optical distance $L_2$ corresponds to an optical distance of the second resonance structure $E_2$.

The phase shift $\varphi$ is a value calculated by $\Delta\varphi_1 + \Delta\varphi_2$, where $\Delta\varphi_1$ is a phase shift caused by reflection of light on the reflector 13, and $\Delta\varphi_2$ is a magnitude of the phase shift caused by reflection of light on the second electrode 18.

$\Delta\varphi_1$ can be specified with a refractive index of the reflector 13, an absorption coefficient of the reflector 13, a refractive index of the interlayer film 14 in contact with the reflector 13, and the like. $\Delta\varphi_2$ can be specified with the refractive index of the reflector 13, the absorption coefficient of the reflector 13, the refractive index of the interlayer film 14 in contact with the reflector 13, and the like. For a method for specifying the phase shift, for example, the description of Principles of Optics, Max Born and Emil Wolf, 1974 (PERGAMON PRESS) and the like can be referred to.

(Configuration in which Resonance Order of First Resonance Structure and Resonance Order of Second Resonance Structure are Different)

In the display apparatus 10 according to the first embodiment, the configuration in which the resonance order of the first resonance structure E1 is different from the resonance order of the second resonance structure E2 (the configuration in which the resonance orders are unequal) is achieved, for example, as shown in the example of FIG. 3, by setting the thickness (Wr1) of the portion of the reflector 13 corresponding to the first region Sc and the thickness (Wr2) of the portion of the reflector 13 corresponding to the second region Sp to values different from each other in accordance with the resonance order of the first resonance structure E1 and the resonance order of the second resonance structure E2. At this time, a separation distance from the first electrode 15 to the reflector 13 in the portion corresponding to the first region Sc is a distance determined on the basis of an optical distance corresponding to the resonance order of the first resonance structure E1. A separation distance from the first electrode 15 to the reflector 13 in the portion corresponding to the second region Sp is a distance determined on the basis of an optical distance corresponding to the resonance order of the second resonance structure E2. In the example of FIGS. 1, 2A, 2B, and 3, a configuration in which the resonance order of the first resonance structure E1 and the resonance order of the second resonance structure E2 are individually different is adopted for each of the resonator structures 102R, 102G, and 102B. However, a configuration in which the resonance order of the first resonance structure E1 and the resonance order of the second resonance structure E2 are individually different may be adopted for a part of the resonator structures 102R, 102G, and 102B.

Note that the example of FIGS. 1, 2A, 2B, and 3 also represent that the configuration in which the resonance order of the first resonance structure E1 is different from the resonance order of the second resonance structure E2 is achieved by setting a film thickness of the interlayer film 14 to a value according to the resonance order of each of the portion corresponding to the first region and the portion corresponding to the second region. That is, in the example shown in FIG. 3, in a case where the thickness from the first surface of the reflector 13 to the first surface of the interlayer film 14 (the first surface of the interlayer film 14B) in the interlayer film 14 in the portion corresponding to the first region Sc is A1, and the thickness from the first surface of the reflector 13 to the first surface of the interlayer film 14 (the first surface of the interlayer film 14B) in the interlayer film 14 in the portion corresponding to the second region Sp is A2, the separation distance from the first electrode 15 to the reflector 13 in the portion corresponding to the first region Sc corresponds to A1, and the separation distance from the first electrode 15 to the reflector 13 in the portion corresponding to the second region Sp corresponds to A2. Therefore, A1 and A2 are distances determined on the basis of the optical distance corresponding to the resonance order of the first resonance structure E1 and the optical distance corresponding to the resonance order of the second resonance structure E2, respectively. In the example of FIGS. 1 and 3, A1 and A2 corresponding to the separation distance from the first electrode 15 to the reflector 13 have different values. Note that, as for the thicknesses A1 and A2, as shown in FIG. 1, thicknesses (A1R, A2R, A1G, A2G, A1B, and A2B) are determined for every one of the subpixels 101R, 101G, and 101B.

The resonator structure 102 shown in the example of the display apparatus 10 in FIG. 3 illustrates a case where the resonance order of the second resonance structure $E_2$ is larger than the resonance order of the first resonance structure $E_1$. Examples of such a case include a case where the resonance order $m_1$ of the first resonance structure $E_1$ is 1 and the resonance order $m_2$ of the second resonance structure $E_2$ is 2. In this case, the optical distance $L_1$ and the optical distance $L_2$ according to the resonance order of the first resonance structure E and the resonance order of the second resonance structure $E_2$ can be determined from the formulas 1 and 2 of the above resonance condition in accordance with the condition of the values of φ and λ. Furthermore, in this case, the optical distance $L_2$ is longer than the optical distance $L_1$. Then, the shape of the reflector 13 can be determined so as to satisfy the determined $L_1$ and $L_2$. In the display apparatus 10 shown in the example of FIG. 3, a step (thickness difference) is formed on a side of the first surface of the reflector 13. That is, the thickness Wr2 of the portion corresponding to the second region Sp is smaller than the thickness Wr1 of the portion corresponding to the first region Sc in the thickness of the reflector 13. With this configuration, the position of the first surface of the reflector 13 is such a position that the portion corresponding to the second region Sp is farther from the second electrode 18 than the portion corresponding to the first region Sc so as to satisfy the optical distance $L_1$ and the optical distance $L_2$.

Specific values of the optical distance $L_1$ and the optical distance $L_2$ can be specified in accordance with conditions such as the thickness (($d_1 1, d_1 2, \ldots d_1 k_1$), ($d_2 1, d_2 2, \ldots, d_2 k_2$)), the refractive index (($n_1 1, n_1 2, \ldots, n_1 k_1$), ($n_2 1, n_2 2, \ldots, n_2 k_2$)), φ, and λ of each layer forming the organic EL element 100. Each layer is configured as follows.

(First Electrode)

The plurality of first electrodes 15 is provided on a side of the first surface of the drive substrate 11. The plurality of first electrodes 15 is two-dimensionally disposed corresponding to the layout of the subpixels 101. The plurality of first electrodes 15 is formed on the first surface of the interlayer film 14 described later.

In the examples of FIGS. 1, 2A, 2B, and 3, the first electrode 15 is an anode. When a voltage is applied to the first electrode 15 and the second electrode 18, holes (positive holes) are injected from the first electrode 15 into the organic EL layer 17. From the viewpoint of improving a light emission efficiency of the organic EL element 100, the first electrode 15 preferably includes a material having a high work function and a high transmittance. The first electrode 15 is preferably a transparent electrode. The transparent electrode is not limited, and includes, for example, a transparent conductive oxide (TCO). Examples of the transparent conductive oxide include indium-based transparent conductive oxide, tin-based transparent conductive oxide, and zinc-based transparent conductive oxide. The transparent electrode may include a plurality of kinds of various transparent conductive oxides exemplified above.

The indium-based transparent conductive oxide represents a transparent conductive oxide containing indium, and examples of the indium-based transparent conductive oxide include a group of compounds such as indium tin oxide (ITO), indium zinc oxide (IZO), and indium gallium oxide (IFO). The tin-based transparent conductive oxide represents a tin-containing transparent conductive oxide, and examples of the tin-based transparent conductive oxide include a group of compounds such as tin oxide, antimony-doped tin oxide (ATO), and fluorine-doped tin oxide (FTO). The zinc-based transparent conductive oxide represents a transparent conductive oxide containing zinc, and examples of the zinc-based transparent conductive oxide include a group of compounds such as zinc oxide, aluminum-doped zinc oxide (AZO), and boron-doped zinc oxide. From the viewpoint of reducing a driving voltage of the display apparatus 10, it is preferable to use an electrode including ITO as the transparent electrode for the first electrode 15.

(Insulating Layer)

The insulating layer 12 having the opening 120 is formed between the adjacent first electrodes 15. The insulating layer 12 is formed on the surface of the interlayer film 14 described later and the first surface of the first electrode 15. The opening 120 in the insulating layer 12 is formed at a position where the first electrode 15 is formed in a plan view of the display apparatus 10. The opening 120 is formed in a pattern according to an arrangement pattern of the subpixels 101, and one section of the opening 120 defines a unit section of the subpixel 101. As shown in the examples of FIGS. 1, 2A, 2B, and 3, the opening 120 is provided on the first surface of each of the first electrodes 15. The opening 120 being formed on the first surface of the first electrode 15 indicates that the insulating layer 12 is formed so as to cover a side end surface and an outer edge of the upper surface (first surface) of the first electrode 15 and to rise on the upper surface of the first electrode 15. Note that the plan view of the display apparatus 10 indicates a case where the up-down direction is a line-of-sight direction. In addition, the insulating layer 12 is a layer that electrically separates the adjacent first electrodes 15. The insulating layer 12 is not limited, and may include an organic insulating film such as a polyimide-based resin or an inorganic insulating film such as silicon nitride.

(Organic EL Layer)

In the display apparatus 10, as shown in FIGS. 1 and 3, the organic EL layer 17 is disposed between the first electrode 15 and the second electrode 18 described later. The organic EL layer 17 covers the first electrode 15 and the insulating layer 12. In the example of the display apparatus 10 in FIG. 1, the organic EL layer 17 is an organic EL layer common to all pixels and all subpixels.

The organic EL layer 17 includes at least a light emitting layer. The light emitting layer includes an organic light emitting material. In the light emitting layer, the holes injected from each of the first electrode 15 and the second electrode 18 and electrons are coupled to each other to generate light. The generated light is the emitted light from the organic EL layer 17.

The organic EL layer 17 may have a structure in which a hole transport layer, a light emitting layer, and an electron transport layer are laminated in this order from the first electrode 15 toward the second electrode 18 (from down to up). The organic EL layer 17 having such a structure can further increase the light emission efficiency. Furthermore, the organic EL layer 17 may have a structure in which a hole injection layer, a hole transport layer, a light emitting layer electron, an injection layer, and an electron transport layer are laminated in this order from the first electrode 15 toward the second electrode 18.

In the examples of FIGS. 1, 2A, 2B, and 3, the emitted light from the organic EL layer 17 is preferably white light in terms of including light of various wavelengths as a component, which does not restrict the color of the emitted light from the organic EL layer 17.

Furthermore, in the examples of FIGS. 1, 2A, 2B, and 3, the organic EL layer 17 is a layer common to all the subpixels 101, but the display apparatus 10 is not limited thereto. In the display apparatus 10, the organic EL layer 17 may be formed for every subpixel 101, or the organic EL layer 17 may be formed for every color type of the subpixel 101. For example, in a case where the organic EL elements 100R, 100G, and 100B are formed for every one of the subpixels 101R, 101G, and 101B, the organic EL layer 17 may be formed in a state in which an organic EL layer that emits red light, an organic EL layer that emits green light, and an organic EL layer that emits blue light corresponding to the organic EL elements 100R, 100G, and 100B are divided from each other. However, in this case as well, the insulating layer 12 and the opening 120 are formed.

(Second Electrode)

In the display apparatus 10, the second electrode 18 is disposed on a side of the first surface of the first electrode 15. In the examples of the display apparatus 10 in FIGS. 1, 2A, 2B, and 3, the second electrode 18 is a layer common to all the subpixels 101, but the display apparatus 10 is not limited thereto. In the display apparatus 10, similar to the organic EL layer 17, the second electrode 18 may be formed for every subpixel 101, or the second electrode 18 may be formed for every color type of the subpixel 101.

In the examples of FIGS. 1, 2A, 2B, and 3, the second electrode 18 is a cathode. When a voltage is applied to the first electrode 15 and the second electrode 18, electrons are injected from the second electrode 18 into the organic EL layer 17. The second electrode 18 is preferably capable of reflecting the emitted light generated from the organic EL layer 17 and transmitting the light resonated in the resonator structure 102. From this viewpoint, the second electrode 18 is preferably a semi-transmissive electrode. The semi-transmissive electrode indicates an electrode having both a property of reflecting light and a property of transmitting light. From the viewpoint of improving a light emission efficiency of the organic EL element 100, the second electrode 18 preferably includes a material having a low work function.

The second electrode 18 may include, for example, a single layer film or a multilayer film of one of the metal layer or the metal oxide layer, or may include a laminated film of a metal layer and a metal oxide layer. In a case where the second electrode 18 includes a laminated film of a metal layer and a metal oxide layer, the metal layer is preferably directed to the organic EL layer 17 from the viewpoint of making a layer having a low work function face the organic EL layer. The metal layer preferably to contains, for example, at least one metal element selected from the metal group consisting of magnesium (Mg), aluminum (Al), silver (Ag), calcium (Ca), sodium (Na), and the like. The metal layer may be an alloy containing a metal element selected from the above metal group as a constituent element. Examples of the metal oxide include ITO, IZO, and ZnO.

(Reflector)

The reflector 13 is provided so as to face toward the second surface of the first electrode 15. The reflector 13 is provided for every first electrode 15, that is, provided for every subpixel 101. Furthermore, the reflector 13 faces the organic EL layer 17 with the first electrode 15 interposed therebetween. The reflector 13 reflects the emitted light from the organic EL layer 17.

The reflector 13 is not limited as long as a surface having light reflectivity can be formed, but preferably includes a layer (reflection layer) containing metal from the viewpoint of enhancing light reflectivity. Examples of the metal include silver (Ag), a silver alloy, aluminum (Al), an aluminum alloy (Al), platinum (Pt), gold (Au), chromium (Cr), and tungsten (W).

The reflector 13 may include a reflection layer, or may have a laminated structure in which a reflection layer is formed on a base layer. In this case, in the reflector 13, the surface on which the reflection layer is formed is the first surface. The base layer preferably includes a layer containing titanium (Ti) or a titanium-based compound. Examples of the titanium-based compound include titanium nitride (TiN) and titanium oxide. Since the reflector 13 has such a laminated structure in which the reflection layer is formed on the base layer, a crystal orientation of the reflection layer can be improved, and a reflectance can be improved.

In the display apparatus 10 according to the first embodiment, the thickness Wr1 of the portion of the reflector 13 corresponding to the first region Sc is different from the thickness Wr2 of the portion corresponding to the second region Sp. The thickness (Wr1, Wr2) of the reflector 13 is determined in accordance with the resonance order of the first resonance structure $E_1$ and the resonance order of the second resonance structure $E_2$ in the resonator structure 102. Furthermore, the shape of the reflector 13 can be determined in accordance with the thickness (Wr1, Wr2) of the reflector 13.

The example of the display apparatus 10 in FIGS. 1, 2A, 2B, and 3 indicate an example of a case where the resonance order of the first resonance structure E1 is smaller than the resonance order of the second resonance structure E2 (for example, a case where the resonance order of the first resonance structure is 1 and the resonance order of the second resonance structure E2 is 2). On the basis of the formulas 1 and 2 indicating the resonance condition described above, under the condition that lights of the same color resonate in the first region Sc and the second region Sp, the optical distance for satisfying the resonance condition becomes longer as the resonance order is larger. From this viewpoint, in the example of FIGS. 1, 2A, 2B, and 3, the thickness and shape of the reflector 13 are determined so that the position on the side of the first surface of the portion corresponding to the second region Sp is farther from the second surface of the first electrode 15 than the position on the side of the first surface of the portion corresponding to the first region Sc.

(Interlayer Film)

The interlayer film 14 is disposed on a side of the second surface of the first electrode 15 and covers the side of the first surface of the reflector 13. In the example of FIGS. 1, 2A, 2B, and 3, the reflector 13 is embedded in the interlayer film 14. Specifically, the interlayer film 14 includes two layers (an interlayer film 14A and an interlayer film 14B), the reflector 13 is disposed on the interlayer film 14A, and the interlayer film 14B is formed so as to cover the reflector 13. The interlayer film 14 covers the first surface of the drive substrate 11. The interlayer film 14 functions as an optical adjustment layer that adjusts the optical distance between the reflector 13 and the second electrode 18. The optical distance between the reflector 13 and the second electrode 18 can be adjusted by determining a distance between the first surface of the interlayer film 14 and the first surface of the reflector 13.

For example, in the example of FIG. 1, the distance (thickness $A_1R$) between the first surface of the interlayer film 14 and the first surface of the reflector 13 (region of the first surface corresponding to the first region Sc) is determined such that the resonator structure 102R has an optical distance $L_1R$ at which red light resonates in the first resonance structure $E_1$ for a portion corresponding to the first region Sc of the organic EL element 100R. Furthermore, the distance (thickness $A_2R$) between the first surface of the interlayer film 14 and the first surface of the reflector 13 (region of the first surface corresponding to the second region Sp) is determined such that the resonator structure 102R has an optical distance $L_2R$ at which red light resonates in the second resonance structure $E_2$ for a portion corresponding to the second region Sp of the organic EL element 100R. Also for each of the organic EL elements 100G and 100B, distances (thicknesses $A_1G$ and $A_1B$) between the first surface of the interlayer film 14 and the first surface of the reflector 13 for a portion corresponding to the first region Sc and distances (thicknesses $A_2G$ and $A_2B$) between the first surface of the interlayer film 14 and the first surface of the reflector 13 for a portion corresponding to the second region Sp are determined.

Then, in the display apparatus 10 in the example of FIG. 1, the shape (thickness) of the reflector 13 is determined so as to satisfy a condition of the distances (thicknesses $A_1R$, $A_1G$, $A_1B$, $A_2R$, $A_2G$, and $A_2B$) corresponding to the organic EL elements 100R, 100G, and 100B. Furthermore, the position of the reflector 13 in the interlayer film 14 is determined so as to satisfy the condition of the distances. In FIG. 1, in the interlayer film 14, the first surface of the interlayer film 14A is a flat surface, and a depth from the first surface of the interlayer film 14B to the position of the reflector 13 is a distance according to the condition of distance described above. Note that this example is merely an example, and the first surface of the interlayer film 14B may be a flat surface, the first surface of the interlayer film 14A may be uneven, and the depth from the first surface of the interlayer film 14B to the position of the reflector 13 may be set to a distance according to the condition of distance described above.

(Protective Layer)

The protective layer 19 is formed on the second electrode 18. The protective layer 19 includes an insulating material. As the insulating material, for example, a thermosetting resin or the like can be used. In addition, the insulating material may be SiO, SiON, AlO, TiO, or the like. In this case, examples of the protective layer 19 include a CVD film containing SiO, SiON, or the like, and an ALD film containing AlO, TiO, SiO, or the like.

(Color Filter Layer)

A color filter layer 103 may be provided on the protective layer 19. The color filter layer 103 may be provided in accordance with the subpixel 101. For example, in a case where the color filter layer 103 is provided in the display apparatus 10 shown in FIG. 1, the color filter layers 101R, 101G, and 101B according to the subpixels 103R, 103G, and 103B are provided. The color purity can be further improved by providing the color filter layer 103 in the display apparatus 10.

(Filling Resin Layer)

Furthermore, a filling resin layer 104 may be formed on the color filter layer 103. The filling resin layer 104 can have a function of protecting the color filter layer 103, and can flatten the side of the first surface of the color filter layer 103. The filling resin layer 104 can have a function as an adhesive layer for bonding the protective layer 19 and a counter substrate 105 described later. Examples of the filling resin layer 104 include an ultraviolet curable resin, a thermosetting resin, and the like.

(Counter Substrate)

The counter substrate 105 is provided on the filling resin layer 104 to face the drive substrate 11. The counter substrate 105 seals the organic EL element 100 together with the filling resin layer 104. The counter substrate 105 preferably includes a material such as glass.

[1-2 Operation and Effect]

In a display apparatus having an organic EL layer, in a case where the first surface of the first electrode has a region exposed from the opening of the insulating layer and a region covered with the insulating layer, and the organic EL layer is formed so as to cover these regions, carriers (holes or the like) may leak in a lateral direction from the opening of the insulating layer toward the region covered with the insulating layer. In this case, there is a possibility that light emission of the organic EL layer occurs not only in the opening but also in the region of a peripheral edge of the opening in the insulating layer.

In the display apparatus having such an organic EL layer, a technique of enhancing light extraction efficiency by providing a resonator structure that resonates emitted light from the organic EL layer has been proposed. In a case where the resonator structure is formed in the display apparatus, not only the emitted light resonates in the portion corresponding to the first region corresponding to the opening but also the emitted light may resonate in the portion corresponding to the second region on the outer side of the first region. In the display apparatus, the portion corresponding to the second region is different from the portion corresponding to the first region, and the insulating layer is formed on the first electrode. In this case, there is a difference between the optical distance between the reflector and the second electrode in the portion corresponding to the first region and the optical distance between the reflector and the second electrode in the portion corresponding to the second region, and lights of different colors may be emitted (color shift) in the first region and the second region. Therefore, in a display apparatus having an organic EL layer, even in a case where a resonator structure is provided and a first region and a second region are formed, it is required to suppress color shift between the first region and the second region.

In the display apparatus 10 according to the first embodiment, the resonance order of the portion corresponding to the first region Sc and the resonance order of the portion corresponding to the second region Sp are different from each other in the resonator structure 102. At this time, in the resonator structure 102, lights of the same color resonate in a state where the resonance orders are different from each other in the portion corresponding to the first region Sc and in the portion corresponding to the second region Sp. Therefore, the display apparatus 10 can suppress the color shift between the first region Sc and the second region Sp.

In addition, in the display apparatus 10 according to the first embodiment, since the resonance orders are different in the portion corresponding to the first region Sc and in the portion corresponding to the second region Sp, processing margins in the portion corresponding to the first region Sc and the portion corresponding to the second region Sp can be secured. For example, in a case where the resonator structure 102B is provided in the display apparatus 10 provided with the blue subpixel 101B, in order to achieve a design in which the resonance order of the portion corresponding to the first region Sc and the resonance order of the portion corresponding to the second region Sp are uniform, normally, a design in which a portion corresponding to the second region Sp of the reflector 13 is located on the side of the first electrode 15 may be required. However, such a design is difficult due to a short distance between the first electrode 15 and the reflector 13. In this regard, in the display apparatus 10 according to the first embodiment, since the resonance orders are different in the portion corresponding to the first region Sc and in the portion corresponding to the second region Sp, it is possible to design the portion corresponding to the second region Sp so as to sufficiently secure the distance between the first electrode 15 and the reflector 13, and it is possible to design the portion corresponding to the second region Sp with excellent feasibility.

[1-3 Modification of Display Apparatus]

Figure 5:
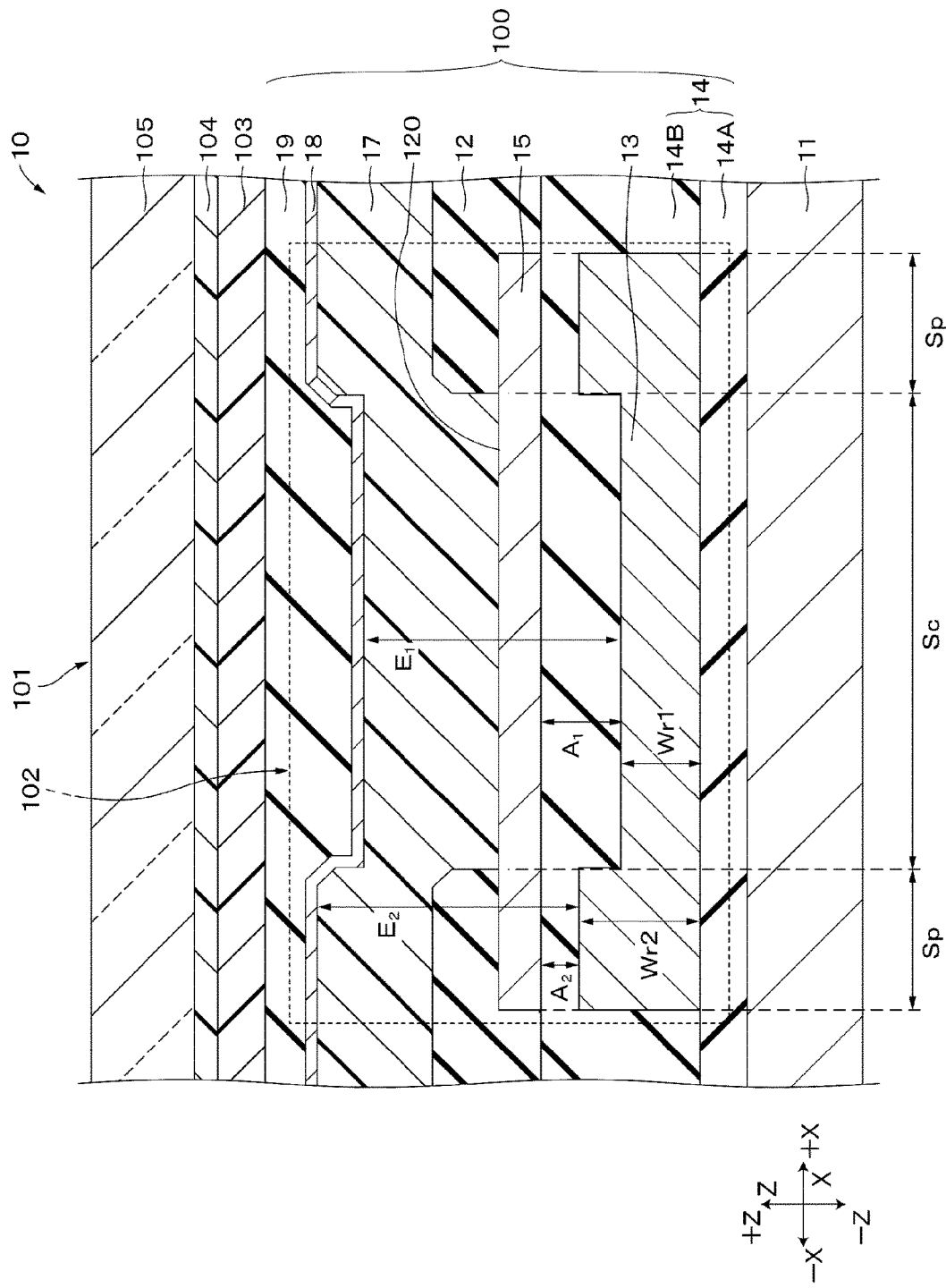
FIG. 5 is a sectional view for describing an implementation example of a modification of the display apparatus according to the first embodiment.

In the example of the display apparatus 10 in FIGS. 1, 2A, 2B, and 3 described above in detail, an example of a case where the resonance order of the second resonance structure E2 is larger than the resonance order of the first resonance structure has been described. In the display apparatus 10, as shown in FIG. 5, the resonance order of the first resonance structure E1 may be larger than the resonance order of the second resonance structure E2. For example, the resonance order of the first resonance structure E1 may be 2, and the resonance order of the second resonance structure E2 may be 1.

In this case, in the display apparatus 10, under the condition that the lights of the same color resonate, the optical distance for satisfying the resonance condition is longer in the first resonance structure $E_1$ having a larger resonance order than in the second resonance structure $E_2$ on the basis of the formulas 1 and 2 indicating the resonance condition described above. In consideration of the above point, in the display apparatus 10, as shown in FIG. 5, the reflector 13 is preferably formed such that the position on the side of the first surface of the portion corresponding to the first region Sc is farther from the first electrode 15 than the position on the side of the first surface of the portion corresponding to the second region Sp. Therefore, in an example shown in FIG. 5, in the reflector 13, the value of the thickness of the portion corresponding to the second region Sp is larger than the value of the thickness of the portion corresponding to the first region Sc.

In the display apparatus 10 according to such a modification, in the resonator structure 102, the lights of the same color resonate in a state where the resonance orders are different in the portion corresponding to the first region Sc and in the portion corresponding to the second region Sp, and it is therefore possible to suppress color shift between the first region Sc and the second region Sp.

2 Second Embodiment

[2-1 Configuration of Display Apparatus]

Figure 6:
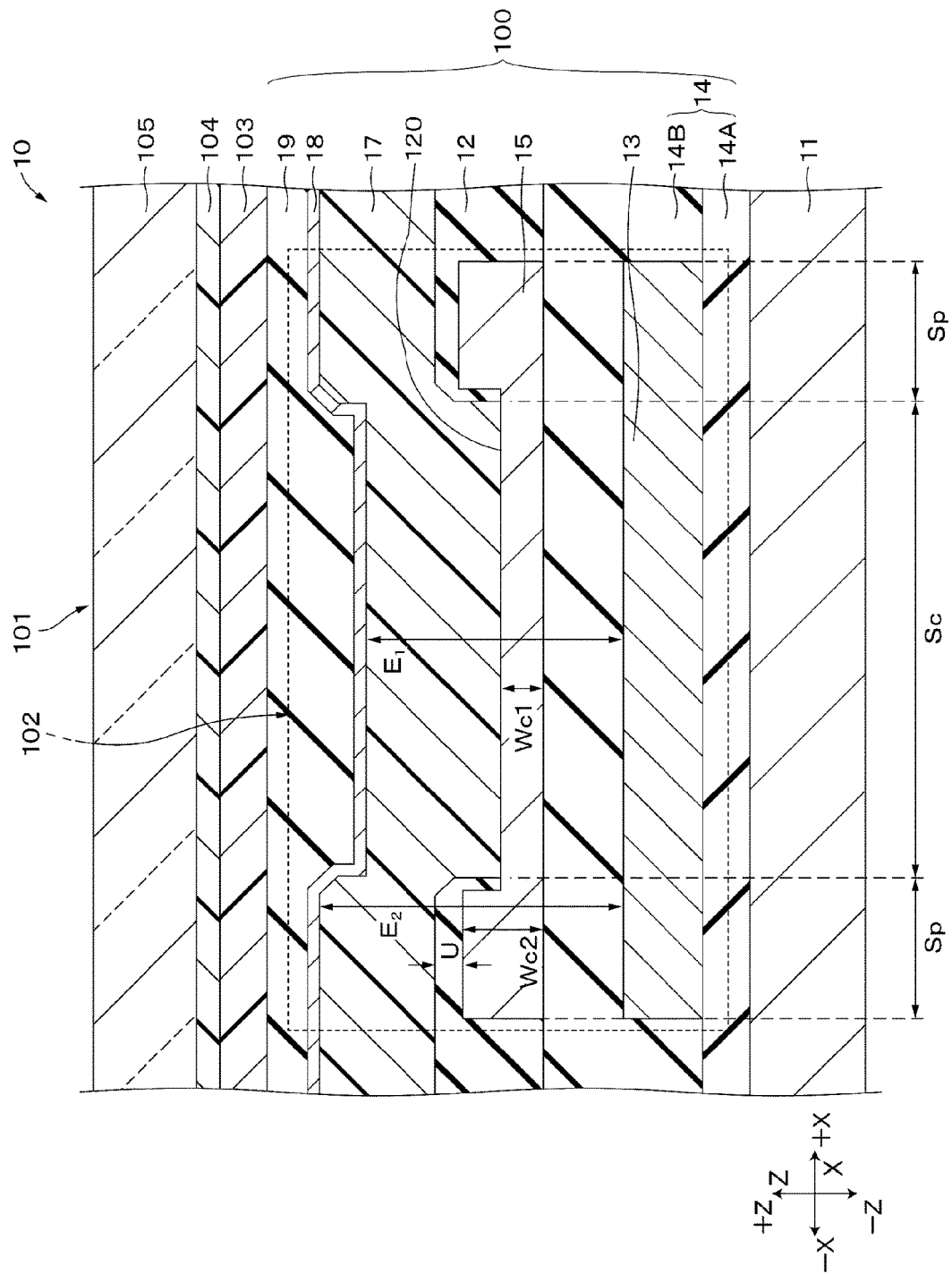
FIG. 6 is a sectional view for describing an implementation example of a display apparatus according to a second embodiment.

The display apparatus 10 according to the second embodiment of the present disclosure will be described. The display apparatus 10 according to the second embodiment, as in the first embodiment, has the resonator structure 102, and has a configuration in which the resonance order of the first resonance structure $E_1$ and the resonance order of the second resonance structure $E_2$ are different in the resonator structure 102. In the second embodiment, the configuration in which the resonance order of the first resonance structure $E_1$ is different from the resonance order of the second resonance structure $E_2$ is achieved by setting a thickness We1 of the portion of the first electrode 15 corresponding to the first region Sc and a thickness We2 of the portion corresponding to the second region Sp to values different from each other in accordance with the resonance order of the first resonance structure $E_1$ and the resonance order of the second resonance structure $E_2$ as shown in FIG. 6. The display apparatus 10 according to the second embodiment is similar to the display apparatus 10 according to the first embodiment except the configuration in which the resonance order of the first resonance structure $E_1$ is different from the resonance order of the second resonance structure $E_2$.

In the display apparatus 10 according to the second embodiment, the configuration in which the resonance order of the first resonance structure $E_1$ is different from the resonance order of the second resonance structure $E_2$ may be adopted in combination with the configuration in which the resonance order of the first resonance structure $E_1$ is different from the resonance order of the second resonance structure $E_2$, described in the first embodiment.

FIG. 6 is a sectional view showing a configuration example of the display apparatus 10 according to the second embodiment, and illustrates an example of a case where the resonance order of the second resonance structure $E_2$ is larger than the resonance order of the first resonance structure $E_1$ (for example, a case where the resonance order of the first resonance structure $E_1$ is 1 and the resonance order of the second resonance structure $E_2$ is 2). In the example of FIG. 6, the first electrode 15 is formed such that the thickness We2 of the portion corresponding to the second region Sp is thicker than the thickness We1 of the portion corresponding to the first region Sc (We2 is larger than We1). The first electrode 15 has a shape in which the portion corresponding to the second region Sp is bulged toward the first surface from the portion corresponding to the first region Sc.

In a case where the resonance order of the second resonance structure $E_2$ is larger than the resonance order of the first resonance structure $E_1$, the optical distance satisfying the resonance condition of the second resonance structure $E_2$ is longer than the optical distance satisfying the resonance order of the first resonance structure $E_1$.

A thickness of a portion of the insulating layer 12 corresponding to the second region Sp is denoted by U. In the display apparatus 10 shown in the example of FIG. 6, U is smaller and We2 is larger (U is relatively small and We2 is relatively large) as compared with the case where the thickness of the first electrode 15 is uniform in the portion corresponding to the first region and the portion corresponding to the second region. In a case where a refractive index of the first electrode 15 is larger than a refractive index of the insulating layer 12, U becomes small and We2 becomes large, and therefore the optical distance of the portion corresponding to the second region can be made longer.

In a case where the refractive index of the first electrode 15 is larger than the refractive index of the insulating layer 12, in the display apparatus 10 shown in the example of FIG. 6, U is small and We2 is large so that the optical distance in the second resonance structure $E_2$ satisfies the resonance condition. That is, the portion corresponding to the second region Sp of the first electrode 15 has a shape bulging toward the first surface from the portion corresponding to the first region Sc so that the optical distance in the second resonance structure $E_2$ satisfies the resonance condition.

[2-2 Operation and Effect]

The display apparatus 10 according to the second embodiment can suppress color shift between the first region Sc and the second region Sp, similarly to the display apparatus according to the first embodiment.

In addition, since the thickness We2 of the portion corresponding to the second region Sp in the first electrode 15 is larger than the thickness We1 of the portion corresponding to the first region, it is possible to control an electric field of the organic EL element 100 (an electric field formed between the first electrode 15 and the second electrode 18) so as to reduce leakage of carriers (holes and the like). Therefore, the display apparatus 10 according to the second embodiment can reduce light emission in the second region Sp and suppress color shift between the first region Sc and the second region Sp.

[2-3 Modifications of Display Apparatus]

(Modification 1)

Figure 7:
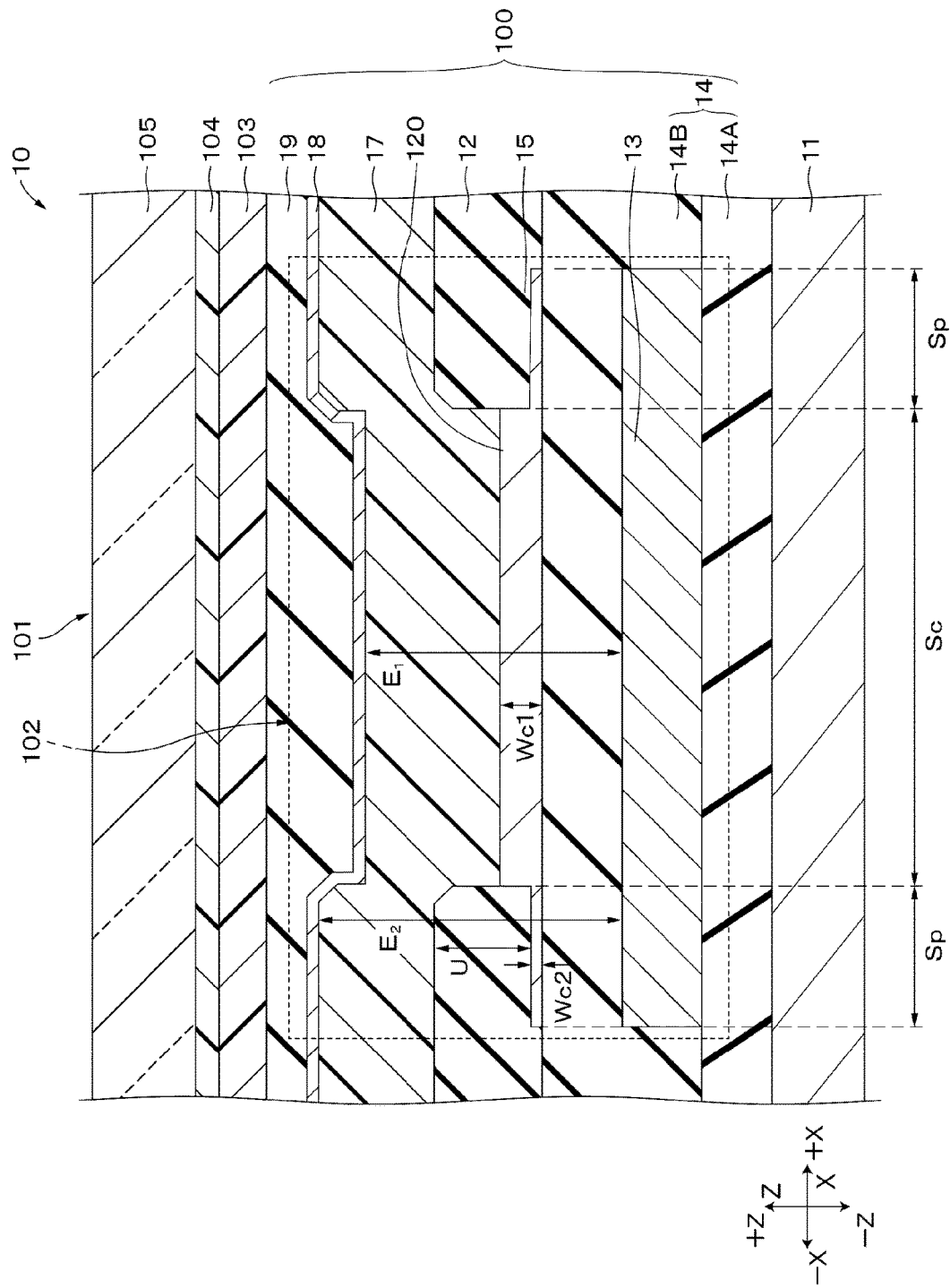
FIG. 7 is a sectional view for describing an implementation example of a modification of the display apparatus according to the second embodiment.

In the example of the display apparatus 10 in FIG. 6 described above in detail, an example of a case where the resonance order of the second resonance structure $E_2$ is larger than the resonance order of the first resonance structure $E_1$ is described. In the display apparatus 10 according to the second embodiment, as shown in FIG. 7, the resonance order of the first resonance structure $E_1$ may be larger than the resonance order of the second resonance structure $E_2$ (Modification 1). That is, the resonance order of the second resonance structure $E_2$ may be smaller than the resonance order of the first resonance structure $E_1$. For example, the resonance order of the first resonance structure $E_1$ may be 2, and the resonance order of the second resonance structure $E_2$ may be 1. The display apparatus 10 according to Modification 1 of the second embodiment can suppress the color shift between the first region Sc and the second region Sp.

In this case, in the display apparatus 10, as shown in FIG. 7, the first electrode 15 is preferably formed in a state where the thickness We1 of the portion corresponding to the first region Sc is thinner than the thickness We2 of the portion corresponding to the second region Sp. The first electrode 15 shown in FIG. 7 has a shape in which the portion corresponding to the second region Sp is recessed on the side of the first surface from the portion corresponding to the first region Sc, and a step is formed at a boundary between the portion corresponding to the second region Sp and the portion corresponding to the first region Sc.

In a case where the resonance order of the second resonance structure $E_2$ is smaller than the resonance order of the first resonance structure $E_1$, the optical distance $L_2$ satisfying the resonance condition of the second resonance structure $E_2$ is shorter than the optical distance $L_1$ satisfying the resonance order of the first resonance structure $E_1$.

In a case where the refractive index of the first electrode 15 is larger than the refractive index of the insulating layer 12, U is relatively large and We2 is relatively small in the portion corresponding to the second region Sp, and thus the optical distance of the portion corresponding to the second region can be shortened. Note that "relatively large" and "relatively small" as for U and We2 indicate comparison in magnitude between the case where the thickness of the first electrode 15 uniform in the portion corresponding to the first region and the portion corresponding to the second region and the case of Modification 1.

In a case where the refractive index of the first electrode 15 is larger than the refractive index of the insulating layer 12, in the display apparatus 10 shown in the example of FIG. 7, U is relatively large and We2 is relatively small so that the optical distance in the second resonance structure $E_2$ satisfies the resonance condition. That is, the thickness We2 of the portion corresponding to the second region Sp of the first electrode 15 is thinner than the thickness We1 of the portion corresponding to the first region Sc so that the optical distances in the second resonance structure $E_2$ and the first resonance structure $E_1$ satisfy the resonance condition. At this time, the thickness U of the insulating layer 12 is relatively thick.

(Modification 2)

Figure 8:
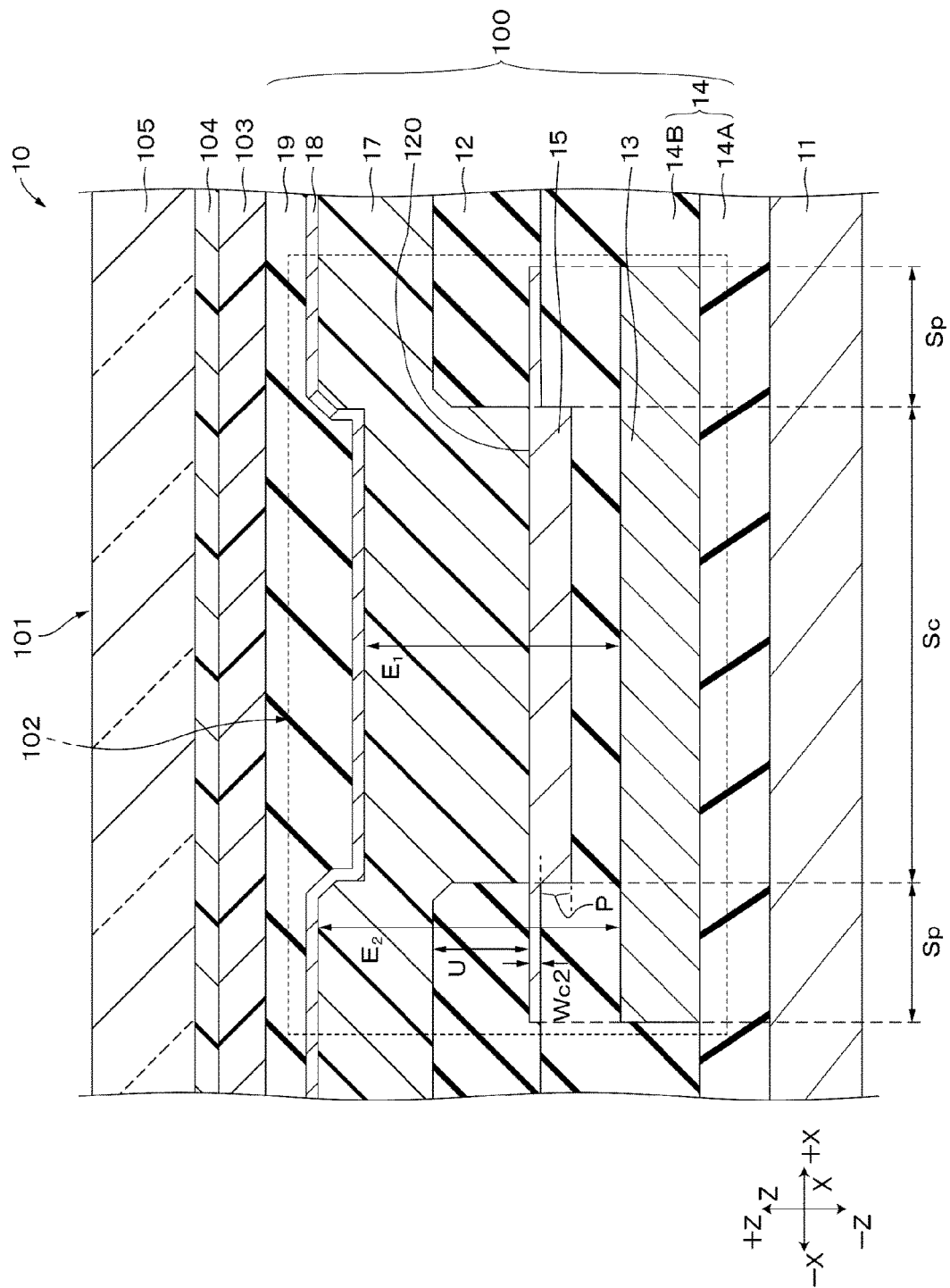
FIG. 8 is a sectional view for describing an implementation example of a modification of the display apparatus according to the second embodiment.

Modification 1 of the display apparatus 10 according to the second embodiment shows an example of a case where the resonance order of the first resonance structure $E_1$ is larger than the resonance order of the second resonance structure $E_2$. In the example, the first electrode 15 has a shape in which the portion corresponding to the second region Sp is recessed on the side of the second surface from the portion corresponding to the first region Sc, and a step is formed at a boundary between the portion corresponding to the second region Sp and the portion corresponding to the first region Sc. The display apparatus 10 according to Modification 1 of the second embodiment is not limited to thereto. That is, as shown in FIG. 8, the first electrode 15 may be in a state in which the portion corresponding to the second region Sp is recessed on the side of the second surface from the portion corresponding to the first region Sc (Modification 2). In an example shown in FIG. 8, the first electrode 15 has a shape in which a step is formed at a boundary between the portion corresponding to the second region Sp and the portion corresponding to the first region Sc. Furthermore, a part of the portion of the first electrode 15 corresponding to the first region Sc is located below the first surface of the interlayer film 14. In FIG. 8, a reference sign P indicates a portion of the first electrode 15 located below the first surface of the interlayer film 14.

In a case where the resonance order of the first resonance structure $E_1$ is larger than the resonance order of the second resonance structure $E_2$, the optical distance $L_1$ satisfying the resonance condition of the first resonance structure $E_1$ is longer than the optical distance $L_2$ satisfying the resonance order of the second resonance structure $E_2$. In a case where the refractive index of the first electrode 15 is larger than the refractive index of the interlayer film 14, the optical distance can be made longer as a portion P of the first electrode 15 is larger. Therefore, the portion P is formed in the first electrode 15 so as to satisfy the optical distance $L_1$ satisfying the resonance condition of the first resonance structure $E_1$ and the optical distance $L_2$ satisfying the resonance order of the second resonance structure $E_2$.

3 Third Embodiment

[3-1 Configuration of Display Apparatus]

The display apparatus 10 according to the third embodiment of the present disclosure will be described. The display apparatus 10 according to the third embodiment, as in the first and second embodiments, has the resonator structure 102, and has a configuration in which the resonance order of the first resonance structure $E_1$ and the resonance order of the second resonance structure $E_2$ are different in the resonator structure 102. In the third embodiment, the configuration in which the resonance order of the first resonance structure $E_1$ is different from the resonance order of the second resonance structure $E_2$ is achieved by setting the thickness of the insulating layer 12 in the portion corresponding to the second region Sp to a value according to the resonance order in the portion corresponding to the second region Sp and the resonance order in the first region Sc. The display apparatus 10 according to the third embodiment is similar to the display apparatus 10 according to the first embodiment except the configuration in which the resonance order of the first resonance structure $E_1$ is different from the resonance order of the second resonance structure $E_2$.

Figure 9:
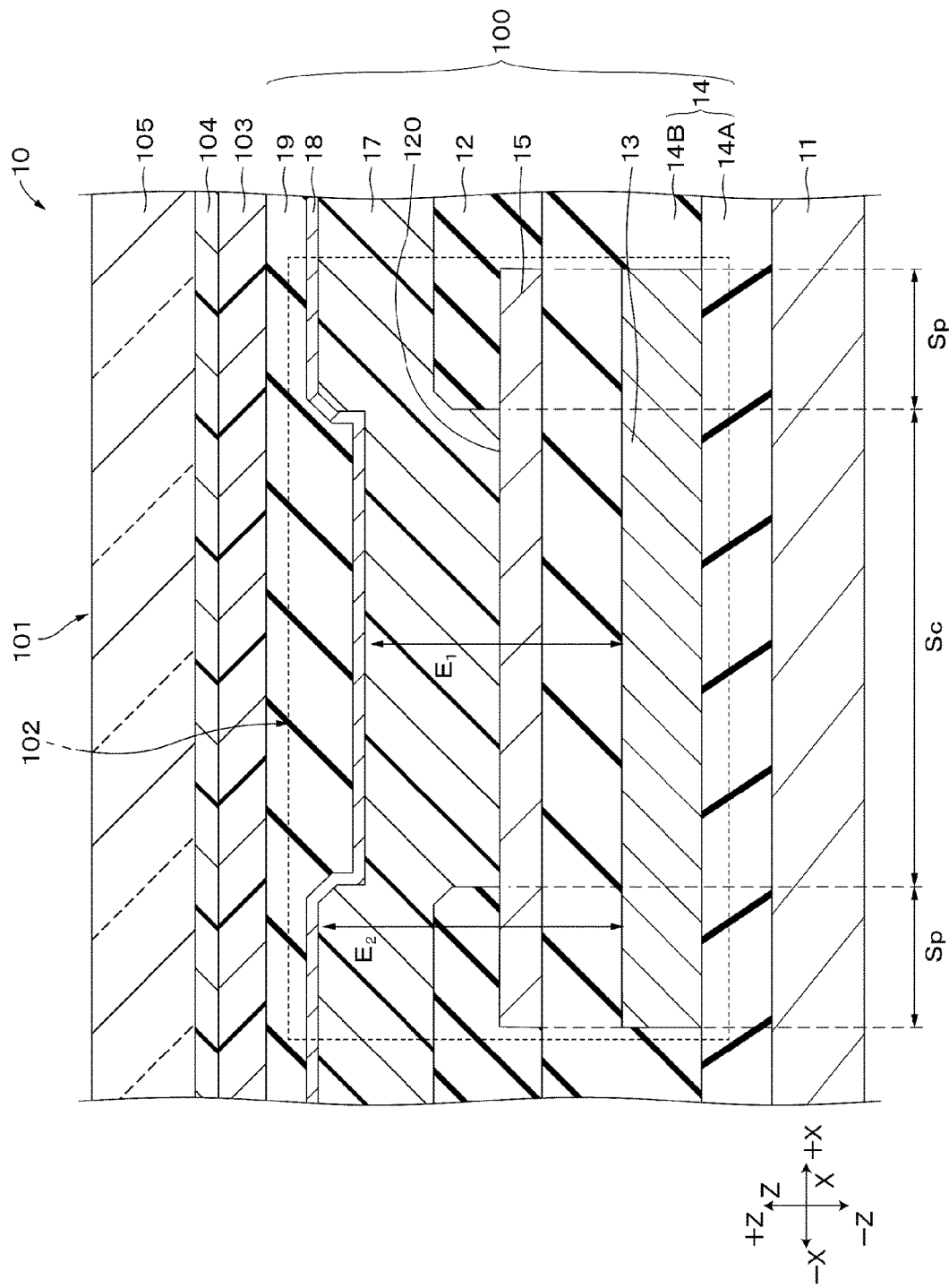
FIG. 9 is a sectional view for describing an implementation example of a display apparatus according to third and fourth embodiments.

In the display apparatus 10 according to the third embodiment, the configuration in which the resonance order of the first resonance structure $E_1$ is different from the resonance order of the second resonance structure $E_2$ may be adopted in combination with one or both of the configurations in which the resonance order of the first resonance structure $E_1$ is different from the resonance order of the second resonance structure $E_2$, described in the first and second embodiments. In the third embodiment, the thickness of the portion corresponding to the first region Sc and the thickness of the portion corresponding to the second region Sp in the reflector 13 may be uniform as shown in FIG. 9, or the thickness of the portion corresponding to the first region Sc and the thickness of the portion corresponding to the second region Sp in the reflector 13 may be different as shown in FIGS. 1 and 3. In addition, as shown in FIG. 5, the thickness of the portion of the first electrode 15 corresponding to the first region Sc may be different from the thickness of the portion corresponding to the second region Sp.

A method for specifying the thickness of the insulating layer 12 in the display apparatus 10 according to the third embodiment will be described. For example, in a case where the resonance order of the second resonance structure $E_2$ is larger than the resonance order of the first resonance structure $E_1$, the thickness of the insulating layer 12 in the portion corresponding to the second region Sp can be specified as follows. Note that, as an example of a case where the resonance order of the second resonance structure $E_2$ is larger than the resonance order of the first resonance structure $E_1$, a case where the resonance order of the first resonance structure $E_1$ is 1 and the resonance order of the second resonance structure $E_2$ is 2 can be exemplified.

The optical distance $L_1$ in the first resonance structure $E_1$ and the optical distance $L_2$ in the second resonance structure $E_2$ are determined in accordance with the conditions of $\varphi$ and $\lambda$ in the first resonance structure $E_1$ and the second resonance structure $E_2$, the resonance order of the first resonance structure $E_1$, and the resonance order of the second resonance structure $E_2$ from the formulas 1 and 2 of the above resonance condition in the description of the first embodiment. In a case where the resonance order of the second resonance structure $E_2$ is larger than the resonance order of the first resonance structure $E_1$, the optical distance $L_2$ is longer than the optical distance $L_1$. For example, in a case where in the portion corresponding to the first region Sc and the portion corresponding to the second region Sp, each of the other layers of the insulating layer 12 has the same refractive index and thickness, the thickness of each layer forming the resonator structure 102 is determined on the basis of the values of $L_1$ and $L_2$ and the refractive index of each layer forming the resonator structure 102, the thickness of each layer required to achieve the optical distance $L_1$ in the first resonance structure $E_1$ is specified, and the value of the product of the refractive index and the thickness of the insulating layer 12 is specified. That is, the value of the product of the refractive index and the thickness of the insulating layer 12 required to achieve the optical distance $L_2$ in the second resonance structure $E_2$ is specified. On the basis of this value, the thickness of the insulating layer 12 is determined in accordance with the refractive index of the insulating layer 12. As described above, in the resonator structure 102, by setting the thickness of the insulating layer 12 to a predetermined value, it is possible to achieve a state in which the resonance order of the first resonance structure and the resonance order of the second resonance structure are different while satisfying the resonance condition.

[3-2 Operation and Effect]

The display apparatus 10 according to the third embodiment can suppress color shift between the first region Sc and the second region Sp, similarly to the display apparatus according to the first embodiment.

4 Fourth Embodiment

[4-1 Configuration of Display Apparatus]

The display apparatus 10 according to the fourth embodiment of the present disclosure will be described. The display apparatus 10 according to the fourth embodiment, as in the first to third embodiments, has the resonator structure 102, and has a configuration in which the resonance order of the first resonance structure $E_1$ and the resonance order of the second resonance structure $E_2$ are different in the resonator structure 102. In the fourth embodiment, the configuration in which the resonance order of the first resonance structure $E_1$ is different from the resonance order of the second resonance structure $E_2$ is achieved by setting the refractive index of the insulating layer 12 in the portion corresponding to the second region Sp to a value according to the resonance order in the portion corresponding to the second region Sp and the resonance order in the first region Sc. The display apparatus 10 according to the fourth embodiment is similar to the display apparatus 10 according to the first embodiment except the configuration in which the resonance order of the first resonance structure $E_1$ is different from the resonance order of the second resonance structure $E_2$.

In the display apparatus 10 according to the fourth embodiment, the configuration in which the resonance order of the first resonance structure $E_1$ is different from the resonance order of the second resonance structure $E_2$ may be adopted in combination with one or more of the configurations in which the resonance order of the first resonance structure $E_1$ is different from the resonance order of the second resonance structure $E_2$, described in the first to third embodiments. In the fourth embodiment, the thickness of the portion corresponding to the first region Sc and the thickness of the portion corresponding to the second region Sp in the reflector 13 may be uniform as shown in FIG. 9, or the thickness of the portion corresponding to the first region Sc and the thickness of the portion corresponding to the second region Sp in the reflector 13 may be different as shown in FIGS. 1 and 3. In addition, as shown in FIG. 5, the thickness of the portion of the first electrode 15 corresponding to the first region Sc may be different from the thickness of the portion corresponding to the second region Sp.

A method for specifying the refractive index of the insulating layer 12 in the display apparatus 10 according to the fourth embodiment will be described. As described in the third embodiment, the optical distance $L_1$ in the first resonance structure $E_1$ and the optical distance $L_2$ in the second resonance structure $E_2$ are determined in accordance with the resonance order of the first resonance structure $E_1$ and the resonance order of the second resonance structure $E_2$ from the formulas 1 and 2 of the above resonance condition in the description of the first embodiment. The thickness of each layer forming the resonator structure 102 is determined on the basis of the values of $L_1$ and $L_2$ and the refractive index of each layer forming the resonator structure 102, and the value of the product of the refractive index and the thickness of the insulating layer 12 required to achieve the optical distance $L_2$ in the second resonance structure $E_2$ is specified. In a case where the thickness of the insulating layer 12 is not defined, a combination of the refractive index of the insulating layer 12 and the thickness of the insulating layer 12 is specified on the basis of the value of the product of the refractive index and the thickness of the insulating layer 12. The combination of the value of the refractive index and the value of the thickness of the insulating layer 12 is a combination according to the resonance order in the portion corresponding to the second region Sp and the resonance order in the portion corresponding to the first region Sc. That is, a state is achieved in which the resonance order of the first resonance structure $E_1$ and the resonance order of the second resonance structure $E_2$ are different in accordance with the combination of the refractive index of the insulating layer 12 and the thickness of the insulating layer 12.

Furthermore, in a case where the thickness of the insulating layer 12 is defined, the refractive index of the insulating layer 12 is determined in accordance with the thickness of the insulating layer 12. As described above, in the resonator structure 102, by setting the refractive index of the insulating layer 12 to a predetermined value, it is possible to achieve a state in which the resonance order of the first resonance structure and the resonance order of the second resonance structure are different while satisfying the formulas 1 and 2 of the resonance condition described above.

In the display apparatus 10 according to the fourth embodiment, in a case where the resonance order of the second resonance structure $E_2$ is larger than the resonance order of the first resonance structure $E_1$ (first case) (for example, a case where the resonance order of the first resonance structure is 1 and the resonance order of the second resonance structure is 2), the optical distance $L_2$ in the second resonance structure $E_2$ is $L_2Q$. In the display apparatus 10 according to the fourth embodiment, in a case where the resonance order of the second resonance structure $E_2$ is smaller than the resonance order of the first resonance structure $E_1$ (second case) (for example, a case where the resonance order of the first resonance structure is 2 and the resonance order of the second resonance structure is 1), the optical distance $L_2$ in the second resonance structure is $L_2R$.

In a case where the resonance order of the second resonance structure in the first case is larger than the resonance order of the second resonance structure $E_2$ in the second case, $L_2Q$ is larger than $L_2R$. Therefore, by forming a layer having a refractive index higher than the refractive index of the insulating layer 12 in the second case as the insulating layer 12 in the first case, the insulating layer 12 in the first case can be formed. By forming a layer having a refractive index lower than the refractive index of the insulating layer 12 in the first case as the insulating layer 12 in the second case, the insulating layer 12 in the second case can be formed. As described above, in the display apparatus 10 according to the fourth embodiment, the insulating layer 12 can be formed so as to achieve a state in which the resonance order of the first resonance structure $E_1$ and the resonance order of the second resonance structure $E_2$ are different in both the first case and the second case.

[4-2 Operation and Effect]

The display apparatus 10 according to the fourth embodiment can suppress color shift between the first region Sc and the second region Sp, similarly to the display apparatus according to the first embodiment.

5 Fifth Embodiment

[5-1 Configuration of Display Apparatus]

Figure 10:
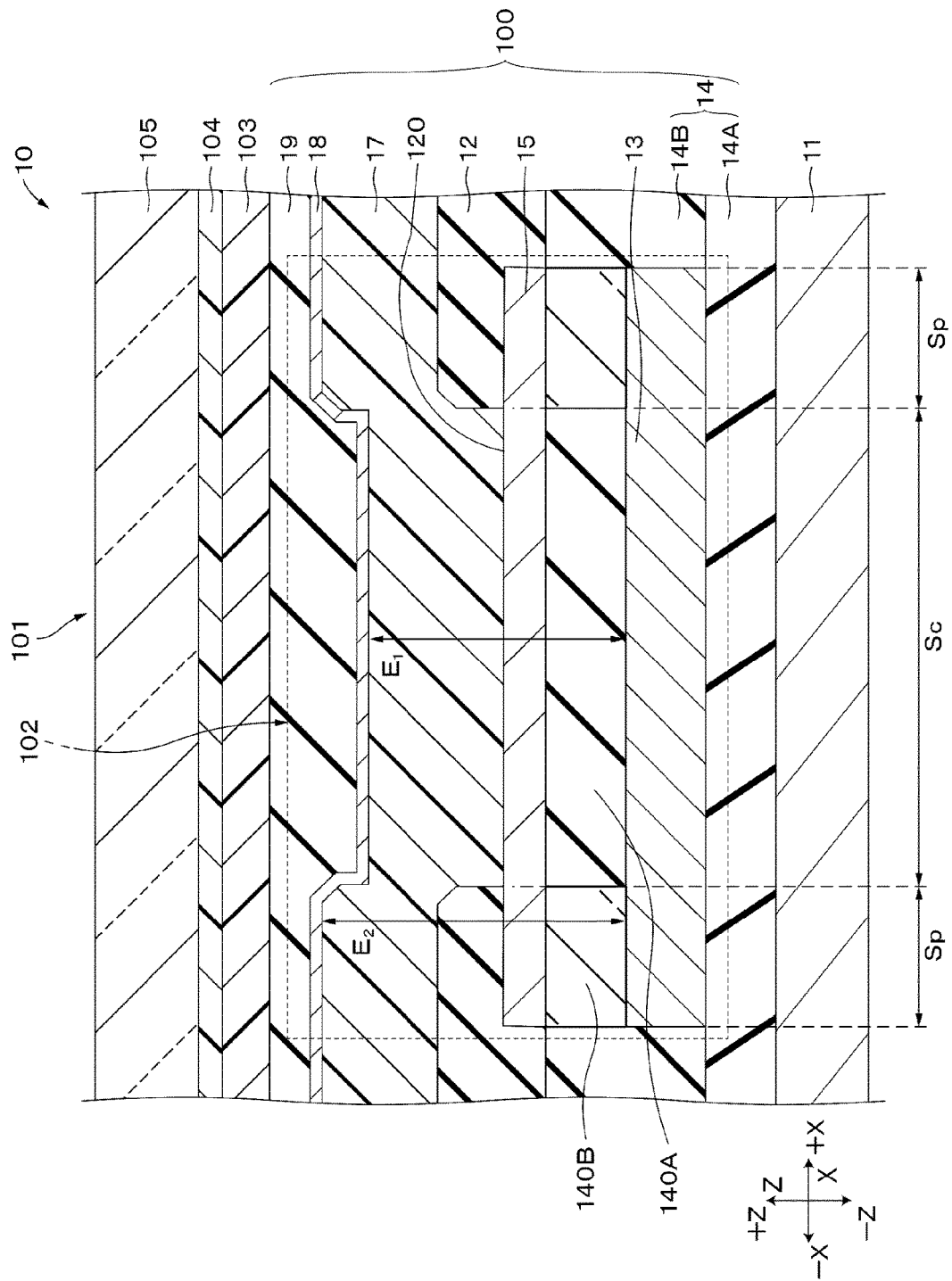
FIG. 10 is a sectional view for describing an implementation example of a display apparatus according to a fifth embodiment.

The display apparatus 10 according to the fifth embodiment of the present disclosure will be described. The display apparatus 10 according to the fifth embodiment, as in the first embodiment, has the resonator structure 102, and has a configuration in which the resonance order of the first resonance structure $E_1$ and the resonance order of the second resonance structure $E_2$ are different in the resonator structure 102. In the fifth embodiment, the configuration in which the resonance order of the first resonance structure $E_1$ is different from the resonance order of the second resonance structure $E_2$ is achieved by setting a refractive index of a portion (first film portion 140A) of the interlayer film 14 corresponding to the first region Sc and a refractive index of a portion (second film portion 140B) of the interlayer film 14 corresponding to the second region Sp to different values in accordance with the resonance order of the first resonance structure $E_1$ and the resonance order of the second resonance structure $E_2$ as shown in FIG. 10. The display apparatus 10 according to the second embodiment is similar to the display apparatus 10 according to the first embodiment except the configuration in which the resonance order of the first resonance structure $E_1$ is different from the resonance order of the second resonance structure $E_2$. FIG. 10 is a sectional view showing a configuration example of the display apparatus 10 according to the second embodiment.

In the display apparatus 10 according to the fifth embodiment, the configuration in which the resonance order of the first resonance structure E is different from the resonance order of the second resonance structure $E_2$ may be adopted in combination with any one or more of the configurations in which the resonance order of the first resonance structure $E_1$ is different from the resonance order of the second resonance structure $E_2$, described in the first to fourth embodiments.

A method for specifying the refractive index of the first film portion 140A and the refractive index of the second film portion 140B in the display apparatus 10 according to the fifth embodiment will be described. As described in the third and fourth embodiments, the optical distance $L_1$ in the first resonance structure $E_1$ and the optical distance $L_2$ in the second resonance structure $E_2$ are determined in accordance with the resonance order of the first resonance structure $E_1$ and the resonance order of the second resonance structure $E_2$ from the formulas 1 and 2 of the above resonance condition in the description of the first embodiment. The thickness of each layer forming the resonator structure 102 is determined on the basis of the values of $L_1$ and $L_2$ and the refractive index of each layer forming the resonator structure 102. At this time, the value of the product of the refractive index and the thickness of the first film portion 140A required to achieve the optical distance $L_1$ in the first resonance structure $E_1$ is specified. Furthermore, the value of the product of the refractive index and the thickness of the second film portion 140B required to achieve the optical distance $L_2$ in the second resonance structure $E_2$ is specified. On the basis of these values, the refractive index of the first film portion 140A is determined in accordance with the thickness of the first film portion 140A, and the refractive index of the second film portion 140B is determined in accordance with the thickness of the second film portion 140B. As described above, in the resonator structure 102, by setting the refractive index of the first film portion 140A and the refractive index of the second film portion 140B to predetermined values, it is possible to achieve a state in which the resonance order of the first resonance structure and the resonance order of the second resonance structure are different while satisfying the formulas 1 and 2 of the resonance condition described above.

In the display apparatus 10 according to the fifth embodiment, in a case where the resonance order of the second resonance structure $E_2$ is larger than the resonance order of the first resonance structure $E_1$ (first case) (for example, a case where the resonance order of the first resonance structure is 1 and the resonance order of the second resonance structure is 2), the optical distance $L_2$ in the second resonance structure $E_2$ is $L_2Q$. In the display apparatus 10 according to the fifth embodiment, in a case where the resonance order of the second resonance structure $E_2$ is smaller than the resonance order of the first resonance structure $E_1$ (second case) (for example, a case where the resonance order of the first resonance structure is 2 and the resonance order of the second resonance structure is 1), the optical distance $L_2$ in the second resonance structure $E_2$ is $L_2R$. In a case where the resonance order of the second resonance structure $E_2$ in the first case is larger than the resonance order of the second resonance structure $E_2$ in the second case, $L_2Q$ is larger than $L_2R$. Therefore, by forming a layer having a refractive index higher than the refractive index of the second film portion 140B in the second case (high refractive index layer) as the second film portion 140B in the first case, the second film portion 140B in the first case can be formed. By forming a layer having a refractive index lower than the refractive index of the second film portion 140B in the first case (low refractive index layer) as the second film portion 140B in the second case, the second film portion 140B in the second case can be formed. In the first film portion 140A, in the first case, a layer having a refractive index lower than the refractive index of the first film portion 140 A in the second case (low refractive index layer) is formed, and in the second case, a layer having a refractive index higher than the refractive index of the first film portion 140A in the first case (high refractive index layer) is formed. As described above, in the display apparatus 10 according to the fourth embodiment, in both the first case and the second case, the interlayer film 14 can include the first film portion 140A and the second film portion 140B so as to achieve a state in which the resonance order of the first resonance structure is different from the resonance order of the second resonance structure.

In the display apparatus 10 according to the fifth embodiment, as a method for forming the first film portion 140A and the second film portion 140B as the low refractive index layer and the high refractive index layer, a method for adjusting a composition and density of each of the first film portion 140A and the second film portion 140B in the interlayer film 14, a method for adjusting a physical structure, and the like can be exemplified. Examples of the method for adjusting the physical structure include a method for forming a crystallized structure and a method for forming an amorphous structure for the first film portion 140A and the second film portion 140B. The method for forming a crystallized structure and the method for forming an amorphous structure in the first film portion 140A and the second film portion 140B can be achieved by adjusting a state of the first surface of the reflector 13.

[5-2 Operation and Effect]

The display apparatus 10 according to the fifth embodiment can suppress color shift between the first region Sc and the second region Sp, similarly to the display apparatus according to the first embodiment.

Next, an example of an embodiment of a method for manufacturing the display apparatus 10 according to one embodiment (a first embodiment) of the present disclosure will be described.

6 Method for Manufacturing Display Apparatus

[6-1 First Embodiment of Manufacturing Method]

In the first embodiment of the manufacturing method, the interlayer film 14A is formed on the first surface of the drive substrate 11 in which a drive circuit is formed on the substrate 11A.

Figure 11A:
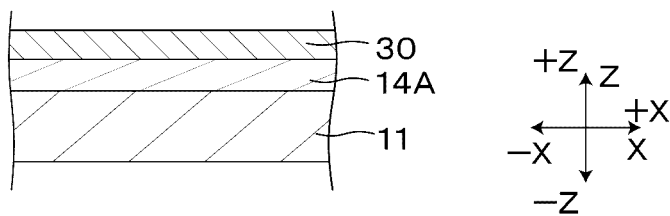
FIGS. 11A, 11B, 11C, 11D, 11E, 11F, and 11G are sectional views for each describing an implementation example of a method for manufacturing a display apparatus.
Figure 11B:
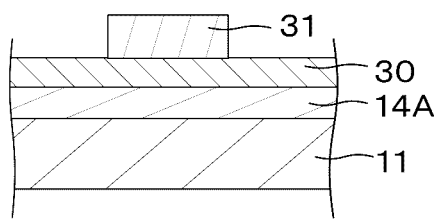
Figure 11C:
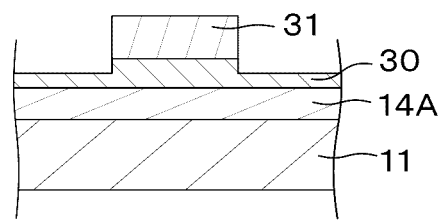
Figure 11D:
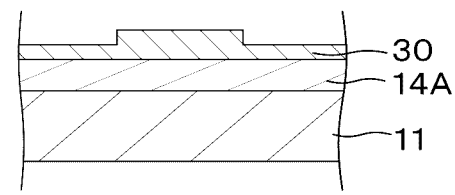
Figure 11E:
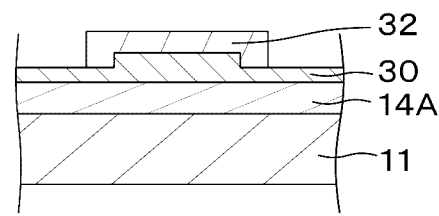

As shown in FIG. 11A, a coating film 30 of a material for forming the reflector 13 is formed on the interlayer film 14A. As the material of the coating film 30, aluminum or the like is preferably used from the viewpoint of ease of handling and high reflectance. The coating film 30 can be formed by using etching or the like. On the coating film 30, a resist 31 is formed in a region corresponding to a portion corresponding to the first region Sc of the reflector 13 (FIG. 11B), and dry etching is performed (first dry etching). In the first dry etching, a thickness of an exposed portion (non-resist portion) of the coating film 30 is set to a thickness of a portion corresponding to the second region Sp of the reflector 13 (FIG. 11C). This thickness is determined in accordance with the optical distance $L_2$ satisfying the resonance condition required for the portion corresponding to the second region Sp in the resonator structure 102.

Figure 11F:
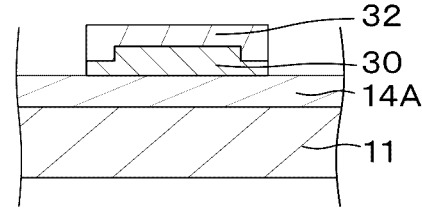
Figure 11G:
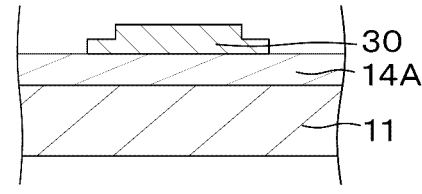

Next, the resist 31 is removed (FIG. 11D), the resist 32 is further formed in a region corresponding to a portion where the reflector 13 is to be formed (FIG. 11E), and dry etching is performed (second dry etching) (FIG. 11F). Then, the resist 32 is removed. As a result, the reflector 13 is formed on the interlayer film 14A (FIG. 11G). A step after the reflector 13 is formed can be performed as follows, for example.

The interlayer film 14B is formed so as to cover the reflector 13. Thus, the interlayer film 14 is formed. Examples of a method for forming the interlayer films 14A and 14B include coating methods such as a vacuum vapor deposition method, a spin coating method, and a die coating method.

The first electrode 15 is formed on the interlayer film 14, and the insulating layer 12 is further laminated. A plurality of first electrodes 15 is formed according to an alignment of the subpixels 101, and the opening 120 is formed in the insulating layer 12 in accordance with the pattern of the subpixels 101. The first electrode 15 and the insulating layer 12 can be formed by, for example, a sputtering method, chemical vapor deposition (CVD), atomic layer deposition (ALD), or the like.

The organic EL layer 17 is formed on the first electrode 15 and the insulating layer 12. In a case where the organic EL layer 17 has, for example, a laminated structure in which a hole transport layer, a light emitting layer, and an electron transport layer are laminated in this order, layers that form the electron transport layer, the light emitting layer, and the hole transport layer are sequentially laminated. Examples of a method for forming these layers include coating methods such as a vacuum vapor deposition method, a spin coating method, and a die coating method.

The second electrode 18 and the protective layer 19 are formed on the organic EL layer 17. The second electrode 18 and the protective layer 19 can be formed by appropriately using a known method or the like.

The color filter layer 103 may be formed on the protective layer 19. The filling resin layer 104 may be formed on the protective layer 19. The counter substrate 105 may be disposed on the filling resin layer 104. The formation of the color filter layer 103 and the filling resin layer 104 and the arrangement of the counter substrate 105 can be appropriately achieved by using a known method or the like. In this manner, the display apparatus 10 is formed.

The method of manufacturing the display apparatus 10 is not limited to the embodiment described above, and may be the following method (a second embodiment of the manufacturing method).

[6-2 Second Embodiment of Manufacturing Method]

As in the first embodiment of the manufacturing method described above, the interlayer film 14A is formed on the first surface of the drive substrate 11 in which the drive circuit is formed on the substrate 11A.

Figure 12A:
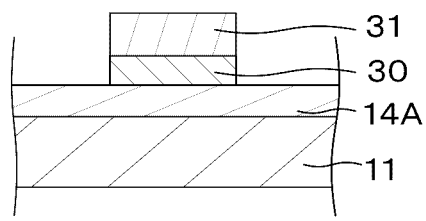
FIGS. 12A, 12B, 12C, 12D, and 12E are sectional views for each describing an implementation example of the method for manufacturing a display apparatus.
Figure 12B:
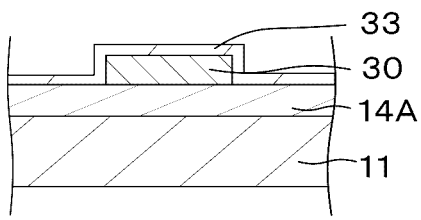
Figure 12C:
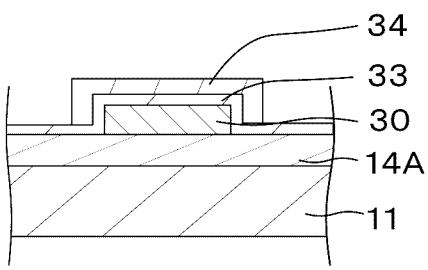

The coating film 30 of a material for forming the reflector 13 is formed on the interlayer film 14A. At this time, as the material, aluminum or the like is preferably used as in the first embodiment of the manufacturing method. On the coating film 30, the resist 31 is formed in the region corresponding to the portion corresponding to the first region Sc of the reflector 13, and dry etching is performed (first dry etching) (FIG. 12A). In the first dry etching, a portion of the coating film 30 on an outer side of a portion corresponding to the first region Sc of the reflector 13 is removed to leave the portion corresponding to the first region Sc of the reflector 13. Next, the resist 31 is removed, and a coating film (additional coating film 33) of a material for forming the reflector 13 is further formed on the film 30 and the interlayer film 14A (FIG. 12B). As the material for forming the additional coating film 33, a similar material to the material for forming the coating film 30 can be used. However, this is not limited to the case where the material for forming the additional coating film 33 is the same as the material for forming the coating film 30, and the material for forming the additional coating film 33 may be different from the material for forming the coating film 30. For example, the coating film 30 may include aluminum (Al), and the additional coating film 33 may include silver (Ag).

Figure 12D:
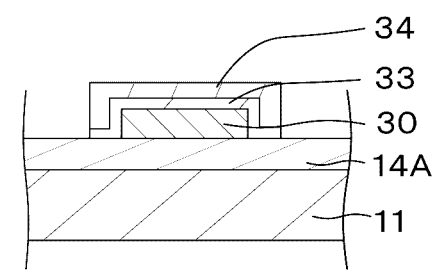
Figure 12E:
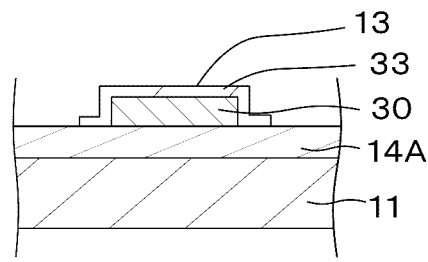

A resist 34 is formed in a region corresponding to a portion where the reflector 13 is to be formed on the additional coating film 33 (FIG. 12C), and dry etching is performed (second dry etching) (FIG. 12D). Then, the resist 34 is removed. As a result, the reflector 13 is formed on the interlayer film 14A (FIG. 12E). Note that a thickness of the coating film 30 and a thickness of the additional coating film 33 are determined in accordance with thicknesses of portions of the reflector 13 corresponding to the first region Sc and the second region Sp.

A step after the reflector 13 is formed may be performed in a similar manner to the step after the reflector 13 is formed as described in the first embodiment of the above manufacturing method. In this manner, the display apparatus 10 can be manufactured.

7 Application Examples (Electronic Device)

The display apparatus 10 according to the one embodiment described above may be included in various electronic devices. In particular, the display apparatus 10 is preferably included in devices that require high resolution and are enlarged and used near eyes, such as an electronic viewfinder of a video camera or a single-lens reflex camera, a head mounted display, and the like.

Specific Example 1

Figure 13A:
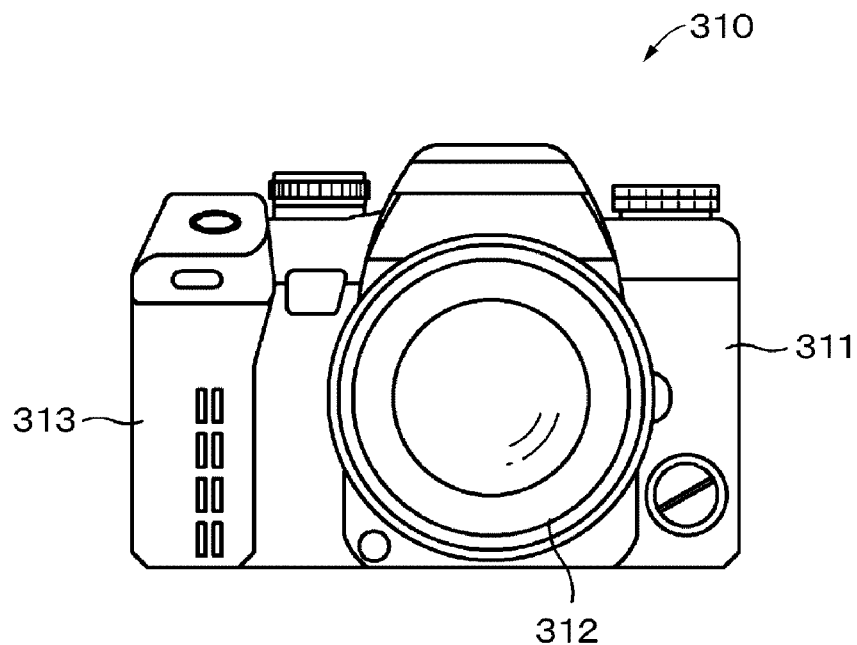
Figure 13B:
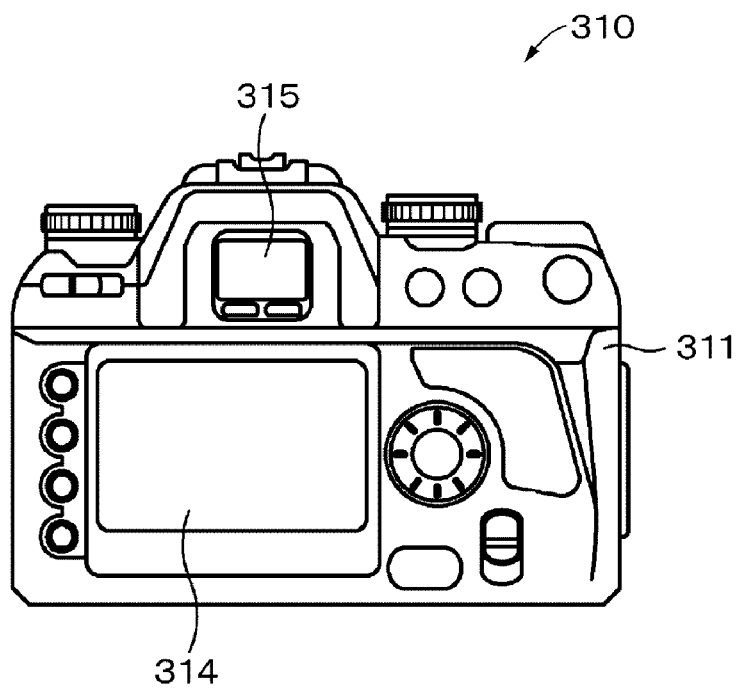

FIG. 13A is a front view illustrating an example of an external appearance of a digital still camera 310. FIG. 13B is a rear view illustrating an example of the external appearance of the digital still camera 310. The digital still camera 310 is of a lens interchangeable single lens reflex type, and includes an interchangeable imaging lens unit (interchangeable lens) 312 substantially at a center in front of a camera body 311, and a grip 313 to be held by a photographer on the front left side.

A monitor 314 is provided at a position shifted to the left side from the center of a rear surface of the camera body 311. An electronic viewfinder (eyepiece window) 315 is provided above the monitor 314. By looking into the electronic viewfinder 315, the photographer can determine a composition by visually recognizing an optical image a subject guided from the imaging lens unit 312. As the electronic viewfinder 315, any of the display apparatuses 10 according to the one embodiment and modifications described above can be used.

Specific Example 2

Figure 14:
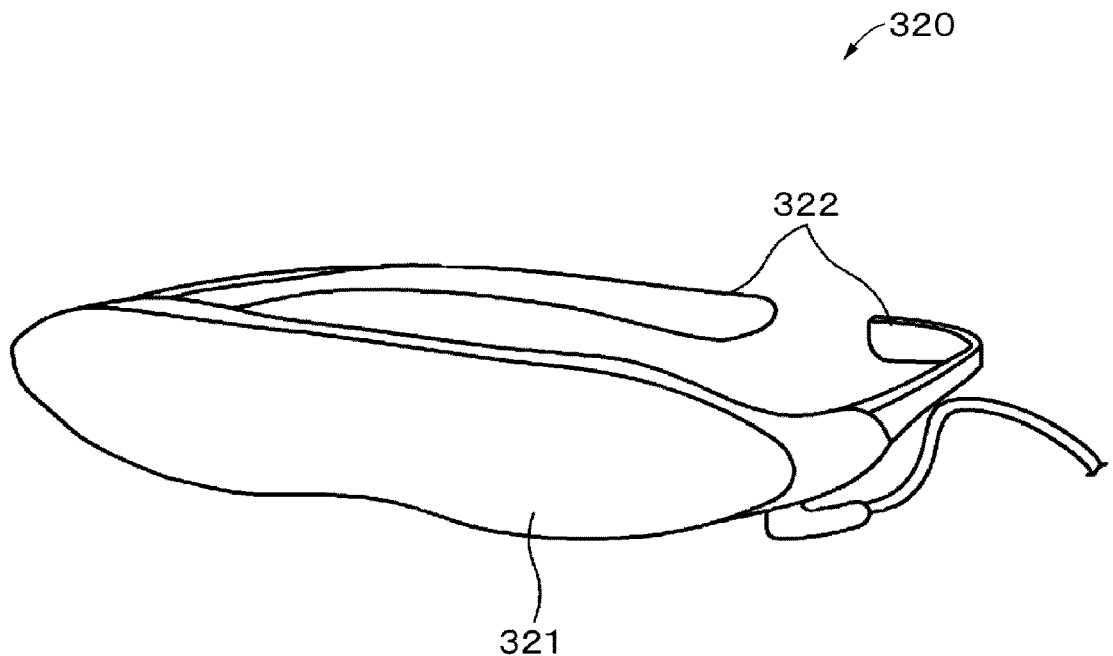

FIG. 14 is a perspective view illustrating an example of an external appearance of a head mounted display 320. The head mounted display 320 includes, for example, ear hooks 322 to be worn on the head of the user on both sides of a glass-shaped display unit 321. As the display unit 321, any one of the display apparatuses 10 according to the one embodiment and modification described above can be used.

Specific Example 3

Figure 15:
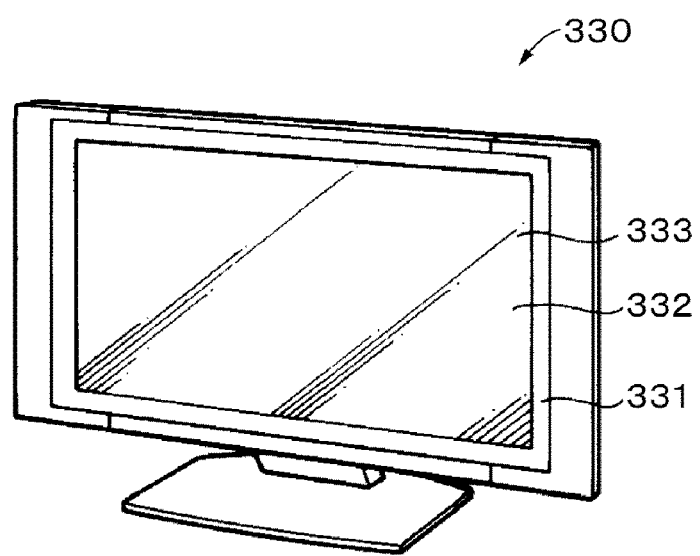

FIG. 15 is a perspective view illustrating an example of an external appearance of a television apparatus 330. The television apparatus 330 includes, for example, a video display screen 331 including a front panel 332 and a filter glass 333, and the video display screen 331 is configured by any of the display apparatuses 10 according to the one embodiment and modifications described above.

The display apparatus, the method for manufacturing the display apparatus (the first embodiment of the manufacturing method and the second embodiment of the manufacturing method), and the application examples according to the first to fifth embodiments and the modifications of the present disclosure have been specifically described above. However, the present disclosure is not limited to the display apparatus, the method for manufacturing the display apparatus, and the application examples according to the first to fifth embodiments and the modifications described above. Various changes based on the technical idea of the present disclosure can be made.

For example, the configurations, methods, steps, shapes, materials, numerical values, and the like described in the display apparatus, the method for manufacturing the display apparatus, and the application examples according to the first to fifth embodiments and the modifications are merely examples, and different configurations, methods, steps, shapes, materials, numerical values, and the like may be used as necessary.

The configurations, methods, steps, shapes, materials, numerical values, and the like of the display apparatus, the method for manufacturing the display apparatus, and the application examples according to the first to fifth embodiments and the modifications can be combined with each other without departing from the gist of the present disclosure.

The materials exemplified in the display apparatus, the method for manufacturing the display apparatus, and the application examples according to the first to fifth embodiments and the modifications can be used alone or in combination of two or more unless otherwise specified.

Furthermore, the present disclosure can adopt the following configurations.

(1) A display apparatus includes a plurality of first electrodes disposed two-dimensionally, a second electrode disposed on a side of a first surface of each of the first electrodes, an electroluminescence layer disposed between the first electrodes and the second electrode, a reflector facing a second surface of the first electrodes, an interlayer film covering the reflector, and an insulating layer provided between adjacent first electrodes of the plurality of first electrodes and having a plurality of openings, in which each of the openings is provided on the first surface of each of the first electrodes, and the reflector, the interlayer film, the first electrodes, the electroluminescence layer, and the second electrode constitute a resonator structure that resonates emitted light from the electroluminescence layer, and in a case where a region corresponding to each of the openings is a first region and a region corresponding to an outer side of the first region in a region corresponding to each of the first electrodes is a second region in a plan view, a resonance order of a portion corresponding to the first region and a resonance order of a portion corresponding to the second region are different in the resonator structure.

(2) In the display apparatus according to (1), the resonator structure satisfies the following formulas 7 and 8, and the resonator structure satisfies one of a combination of the following formulas 9 and 10 or a combination of the following formulas 11 and 12.

$2L_1/\lambda + \varphi/2\pi = m_1$ (Formula 7)

$2L_2/\lambda + \mu/2\pi = m_2$ (Formula 8)

$m_1 \geq 2$ (Formula 9)

$m_2 = m_1 \pm 1$ (Formula 10)

$m_1 = 1$ (Formula 11)

$m_2 = 2$ (Formula 12)

(In each of the formulas 7 to 12, $L_1$ represents an optical distance between the reflector and the second electrode in a portion corresponding to the first region, $L_2$ represents the optical distance between the reflector and the second electrode in a portion corresponding to the second region, $\lambda$ represents a peak wavelength of a spectrum of light corresponding to a predetermined color type, $\varphi$ represents a magnitude of a phase shift caused by reflection of light on the reflector and the second electrode, $m_1$ represents an integer that is a resonance order in the portion corresponding to the first region, and $m_2$ represents an integer that is a resonance order in the portion corresponding to the second region.)

(3) In the display apparatus according to (1) or (2), a value of a thickness of the reflector is different in the portion corresponding to the first region and in the portion corresponding to the second region.

(4) In the display apparatus according to (1) or (2), a value of a thickness of the reflector is smaller in the portion corresponding to the second region than in the portion corresponding to the first region.

(5) In the display apparatus according to any one of (1) to (4), a separation distance from each of the first electrodes to the reflector is different in the portion corresponding to the first region and in the portion corresponding to the second region.

(6) In the display apparatus according to any one of (1) to (5), a value of a thickness of each of the first electrodes is different in the portion corresponding to the first region and in the portion corresponding to the second region.

(7) In the display apparatus according to any one of (1) to (5), a value of a thickness of each of the first electrodes is larger in the portion corresponding to the second region than in the portion corresponding to the first region.

(8) In the display apparatus according to any one of (1) to (7), a value of a thickness of the insulating layer is a value according to a resonance order in the portion corresponding to the second region and a resonance order in the portion corresponding to the first region.

(9) In the display apparatus according to any one of (1) to (7), a refractive index of the insulating layer is a value according to a resonance order in the portion corresponding to the second region and a resonance order in the portion corresponding to the first region.

(10) In the display apparatus according to any one of (1) to (7), a combination of a value of a refractive index of the insulating layer and a value of a thickness of the insulating layer is a combination according to a resonance order in the portion corresponding to the second region and a resonance order in the portion corresponding to the first region.

(11) In the display apparatus according to any one of (1) to (10), a refractive index of the interlayer film is different in the portion corresponding to the first region and in the portion corresponding to the second region.

(12) The display apparatus according to any one of (1) to (11) further includes a plurality of subpixels corresponding to a plurality of color types, in which each of the first electrodes is disposed in each of the plurality of subpixels, and the resonator structure resonates light according to the plurality of color types among the emitted light from the electroluminescence layer.

(13) In the display apparatus according to (12), the plurality of color types includes red, blue, and green.

(14) An electronic device includes the display apparatus according to any one of (1) to (13).

REFERENCE SIGNS LIST

10 Display apparatus
11 Drive substrate
11A Substrate
12 Insulating layer
13 Reflector
14 Interlayer film 15 First electrode
17 Organic EL layer
18 Second electrode
19 Protective layer
100 Organic EL element
100B Organic EL element
100G Organic EL element
100R Organic EL element
101 Subpixel
101B Subpixel
101G Subpixel
101R Subpixel
102 Resonator structure
102B Resonator structure
102G Resonator structure
102R Resonator structure
103 Color filter layer
103B Color filter layer
103G Color filter layer
103R Color filter layer
104 Filling resin layer
105 Counter substrate
120 Opening
310 Digital still camera
320 Head mounted display
330 Television apparatus

The invention claimed is:

1. A display apparatus comprising:
a plurality of first electrodes disposed two-dimensionally;
a second electrode disposed on a side of a first surface of each of the first electrodes;
an electroluminescence layer disposed between the first electrodes and the second electrode;
a reflector facing a second surface of each of the first electrodes;
an interlayer film covering the reflector; and
an insulating layer provided between adjacent first electrodes of the plurality of first electrodes and having a plurality of openings, wherein
each of the openings is provided on the first surface of each of the first electrodes, and
the reflector, the interlayer film, each of the first electrodes, the electroluminescence layer, and the second electrode constitute a resonator structure that resonates emitted light from the electroluminescence layer, and
in a case where a region corresponding to each of the openings is a first region and a region corresponding to an outer side of the first region in a region corresponding to each of the first electrodes is a second region in a plan view, a resonance order of a portion corresponding to the first region and a resonance order of a portion corresponding to the second region are different in the resonator structure.

2. The display apparatus according to claim 1, wherein the resonator structure satisfies formulas 1 and 2, and the resonator structure satisfies one of a combination of formulas 3 and 4 or a combination of formulas 5 and 6, $$2L_1/\lambda + \varphi/2\pi = m_1 \quad \text{(Formula 1)}$$

$$2L_2/\lambda + \varphi/2\pi = m_2 \quad \text{(Formula 2)}$$

$$m_1 \geq 2 \quad \text{(Formula 3)}$$

$$m_2 = m_1 \pm 1 \quad \text{(Formula 4)}$$

$$m_1 = 1 \quad \text{(Formula 5)}$$

$$m_2 = 2 \quad \text{(Formula 6)}$$

where, in each of the formulas 1 to 6, $L_1$ represents an optical distance between the reflector and the second electrode in a portion corresponding to the first region, $L_2$ represents the optical distance between the reflector and the second electrode in a portion corresponding to the second region, $\lambda$ represents a peak wavelength of a spectrum of light corresponding to a predetermined color type, $\varphi$ represents a magnitude of a phase shift caused by reflection of light on the reflector and the second electrode, mi represents an integer that is a resonance order in the portion corresponding to the first region, and $m_2$ represents an integer that is a resonance order in the portion corresponding to the second region.

3. The display apparatus according to claim 1, wherein a value of a thickness of the reflector is different in the portion corresponding to the first region and in the portion corresponding to the second region.

4. The display apparatus according to claim 1, wherein a value of a thickness of the reflector is smaller in the portion corresponding to the second region than in the portion corresponding to the first region.

5. The display apparatus according to claim 1, wherein a separation distance from each of the first electrodes to the reflector is different in the portion corresponding to the first region and in the portion corresponding to the second region.

6. The display apparatus according to claim 1, wherein a value of a thickness of each of the first electrodes is different in the portion corresponding to the first region and in the portion corresponding to the second region.

7. The display apparatus according to claim 1, wherein a value of a thickness of each of the first electrodes is larger in the portion corresponding to the second region than in the portion corresponding to the first region.

8. The display apparatus according to claim 1, wherein a value of a thickness of the insulating layer is a value according to a resonance order in the portion corresponding to the second region and a resonance order in the portion corresponding to the first region.

9. The display apparatus according to claim 1, wherein a refractive index of the insulating layer is a value according to a resonance order in the portion corresponding to the second region and a resonance order in the portion corresponding to the first region.

10. The display apparatus according to claim 1, wherein a combination of a value of a refractive index of the insulating layer and a value of a thickness of the insulating layer is a combination according to a resonance order in the portion corresponding to the second region and a resonance order in the portion corresponding to the first region.

11. The display apparatus according to claim 1, wherein a refractive index of the interlayer film is different in the portion corresponding to the first region and in the portion corresponding to the second region.

12. The display apparatus according to claim 1, further comprising a plurality of subpixels corresponding to a plurality of color types, wherein
each of the first electrodes is disposed in each of the plurality of subpixels, and
the resonator structure resonates light according to the plurality of color types among the emitted light from the electroluminescence layer.

13. The display apparatus according to claim 12, wherein the plurality of color types includes red, blue, and green.

14. An electronic device comprising a display apparatus according to claim 1.

* * * * *